United States Patent
Carey et al.

(10) Patent No.: US 8,518,838 B2
(45) Date of Patent: Aug. 27, 2013

(54) METHOD OF THERMAL PROCESSING STRUCTURES FORMED ON A SUBSTRATE

(75) Inventors: Paul Carey, Mountain View, CA (US); Aaron Muir Hunter, Santa Cruz, CA (US); Dean Jennings, Beverly, MA (US); Abhilash J. Mayur, Salinas, CA (US); Stephen Moffatt, St. Lawrence (JE); William Schaffer, Atascadero, CA (US); Timothy N. Thomas, Portland, OR (US); Mark Yam, Monte Sereno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/401,526

(22) Filed: Feb. 21, 2012

(65) Prior Publication Data
US 2012/0145684 A1   Jun. 14, 2012

Related U.S. Application Data

(63) Continuation of application No. 12/855,652, filed on Aug. 12, 2010, which is a continuation of application No. 11/459,856, filed on Jul. 25, 2006, now abandoned.

(60) Provisional application No. 60/780,745, filed on Mar. 8, 2006.

(51) Int. Cl.
*H01L 21/00* (2006.01)
(52) U.S. Cl.
USPC .................................. 438/795; 257/E21.497
(58) Field of Classification Search
USPC .................................. 438/795; 257/E21.497
See application file for complete search history.

(56) References Cited

U.S. PATENT DOCUMENTS

| | | | |
|---|---|---|---|
| 3,633,999 A | 1/1972 | Buckles | |
| 4,234,356 A * | 11/1980 | Auston et al. | 438/799 |
| 4,390,392 A | 6/1983 | Robinson et al. | |
| 4,439,245 A | 3/1984 | Wu | |
| 4,475,027 A | 10/1984 | Pressley | |

(Continued)

FOREIGN PATENT DOCUMENTS

| | | |
|---|---|---|
| EP | 206764 | 12/1986 |
| JP | 2002524846 A | 8/2002 |

(Continued)

OTHER PUBLICATIONS

Office Action dated Aug. 21, 2012 for Japanese Patent Application No. 2008-558449.

(Continued)

*Primary Examiner* — Julio J Maldonado
*Assistant Examiner* — Amar Movva
(74) *Attorney, Agent, or Firm* — Patterson & Sheridan, LLP

(57) ABSTRACT

Methods used to perform an annealing process on desired regions of a substrate are disclosed. In one embodiment, an amount of energy is delivered to the surface of the substrate to preferentially melt certain desired regions of the substrate to remove unwanted damage created from prior processing steps (e.g., crystal damage from implant processes), more evenly distribute dopants in various regions of the substrate, and/or activate various regions of the substrate. The preferential melting processes will allow more uniform distribution of the dopants in the melted region, due to the increased diffusion rate and solubility of the dopant atoms in the molten region of the substrate. The creation of a melted region thus allows: 1) the dopant atoms to redistribute more uniformly, 2) defects created in prior processing steps to be removed, and 3) regions that have hyper-abrupt dopant concentrations to be formed.

20 Claims, 13 Drawing Sheets

(56) References Cited

U.S. PATENT DOCUMENTS

| | | | |
|---|---|---|---|
| 4,511,220 A | 4/1985 | Scully | |
| 4,619,508 A | 10/1986 | Shibuya et al. | |
| 4,744,615 A | 5/1988 | Fan et al. | |
| 4,849,371 A | 7/1989 | Hansen et al. | |
| 4,851,978 A | 7/1989 | Ichihara | |
| 4,953,982 A | 9/1990 | Ebbing et al. | |
| 5,061,025 A | 10/1991 | Debesis | |
| 5,109,465 A | 4/1992 | Klopotek | |
| 5,182,170 A | 1/1993 | Marcus et al. | |
| 5,224,200 A | 6/1993 | Rasmussen et al. | |
| 5,233,460 A | 8/1993 | Partlo et al. | |
| 5,307,207 A | 4/1994 | Ichihara | |
| 5,315,427 A | 5/1994 | Rauch et al. | |
| 5,328,785 A | 7/1994 | Smith et al. | |
| 5,357,365 A | 10/1994 | Ipposhi et al. | |
| 5,453,814 A | 9/1995 | Aiyer | |
| 5,541,138 A | 7/1996 | Yamazaki et al. | |
| 5,561,081 A | 10/1996 | Takenouchi et al. | |
| 5,591,668 A | 1/1997 | Maegawa et al. | |
| 5,610,733 A | 3/1997 | Feldman et al. | |
| 5,612,251 A | 3/1997 | Lee | |
| 5,621,529 A | 4/1997 | Gordon et al. | |
| 5,662,410 A | 9/1997 | Suganuma | |
| 5,699,191 A | 12/1997 | Fork | |
| 5,754,278 A | 5/1998 | Kurtz | |
| 5,852,693 A | 12/1998 | Jeong | |
| 5,888,888 A | 3/1999 | Talwar et al. | |
| 5,918,140 A | 6/1999 | Wickboldt et al. | |
| 5,956,603 A | 9/1999 | Talwar et al. | |
| 6,051,483 A | 4/2000 | Lee et al. | |
| 6,191,887 B1 | 2/2001 | Michaloski et al. | |
| 6,212,012 B1 | 4/2001 | Tanaka | |
| 6,265,291 B1 | 7/2001 | Yu et al. | |
| 6,274,488 B1 | 8/2001 | Talwar et al. | |
| 6,297,135 B1 | 10/2001 | Talwar et al. | |
| 6,300,208 B1 | 10/2001 | Talwar et al. | |
| 6,303,476 B1 | 10/2001 | Hawryluk et al. | |
| 6,324,195 B1 | 11/2001 | Suzuki et al. | |
| 6,348,076 B1 | 2/2002 | Canaperi et al. | |
| 6,365,476 B1 | 4/2002 | Talwar et al. | |
| 6,366,308 B1 | 4/2002 | Hawryluk et al. | |
| 6,376,806 B2 | 4/2002 | Yoo | |
| 6,383,956 B2 | 5/2002 | Hawryluk et al. | |
| 6,387,803 B2 | 5/2002 | Talwar et al. | |
| 6,388,297 B1 | 5/2002 | Talwar et al. | |
| 6,420,264 B1 | 7/2002 | Talwar et al. | |
| 6,479,821 B1 | 11/2002 | Hawryluk et al. | |
| 6,495,390 B2 | 12/2002 | Hawryluk et al. | |
| 6,545,248 B2 | 4/2003 | Tanaka et al. | |
| 6,570,656 B1 | 5/2003 | Owens, Jr. et al. | |
| 6,577,429 B1 | 6/2003 | Kurtz et al. | |
| 6,594,090 B2 | 7/2003 | Kruschwitz et al. | |
| 6,597,430 B1 | 7/2003 | Nishi et al. | |
| 6,635,541 B1 | 10/2003 | Talwar et al. | |
| 6,635,588 B1 | 10/2003 | Hawryluk et al. | |
| 6,645,838 B1 | 11/2003 | Talwar et al. | |
| 6,717,105 B1 | 4/2004 | Okamoto et al. | |
| 6,728,039 B2 | 4/2004 | Tanaka | |
| 6,747,245 B2 | 6/2004 | Talwar et al. | |
| 6,750,424 B2 | 6/2004 | Tanaka | |
| 6,777,317 B2 | 8/2004 | Seibel et al. | |
| 6,780,692 B2 * | 8/2004 | Tatsuki et al. | 438/166 |
| 6,825,101 B1 | 11/2004 | Hawryluk et al. | |
| 6,844,250 B1 | 1/2005 | Wang et al. | |
| 6,849,831 B2 | 2/2005 | Timans et al. | |
| 6,936,505 B2 | 8/2005 | Keys et al. | |
| 6,951,996 B2 | 10/2005 | Timans et al. | |
| 6,956,878 B1 | 10/2005 | Trisnadi | |
| 6,982,476 B2 | 1/2006 | Cleeves et al. | |
| 6,987,240 B2 | 1/2006 | Jennings et al. | |
| 7,005,601 B2 | 2/2006 | Jennings | |
| 7,049,544 B2 | 5/2006 | Landau | |
| 7,097,709 B2 | 8/2006 | Okamoto et al. | |
| 7,098,155 B2 | 8/2006 | Talwar et al. | |
| 7,105,048 B2 | 9/2006 | Yamazaki et al. | |
| 7,135,392 B1 | 11/2006 | Adams et al. | |
| 7,145,104 B2 | 12/2006 | Talwar et al. | |
| 7,154,066 B2 | 12/2006 | Talwar et al. | |
| 7,157,660 B2 | 1/2007 | Talwar et al. | |
| 7,276,457 B2 | 10/2007 | Yoo | |
| 7,319,056 B2 | 1/2008 | Im et al. | |
| 7,569,463 B2 | 8/2009 | Balakrishna et al. | |
| 7,833,871 B2 | 11/2010 | Kawakami et al. | |
| 7,879,741 B2 | 2/2011 | Talwar et al. | |
| 2001/0039098 A1 | 11/2001 | Lu | |
| 2002/0056891 A1 | 5/2002 | Wu | |
| 2002/0067918 A1 | 6/2002 | Camm et al. | |
| 2002/0111043 A1 | 8/2002 | Mahawili | |
| 2003/0040130 A1 | 2/2003 | Mayur et al. | |
| 2003/0073318 A1 | 4/2003 | Sandhu et al. | |
| 2003/0138988 A1 | 7/2003 | Murakami et al. | |
| 2003/0146458 A1 | 8/2003 | Horiuchi et al. | |
| 2004/0108588 A1 | 6/2004 | Gilleo | |
| 2004/0115793 A1 | 6/2004 | Rasmussen et al. | |
| 2004/0188396 A1 | 9/2004 | Talwar et al. | |
| 2005/0087893 A1 | 4/2005 | Chung et al. | |
| 2005/0103998 A1 | 5/2005 | Talwar et al. | |
| 2005/0139961 A1 | 6/2005 | Brunner et al. | |
| 2006/0102607 A1 | 5/2006 | Adams et al. | |
| 2006/0222021 A1 | 10/2006 | Moriwaka | |
| 2007/0032004 A1 | 2/2007 | Ramaswamy et al. | |
| 2007/0080141 A1 * | 4/2007 | White et al. | 216/68 |
| 2007/0196011 A1 * | 8/2007 | Cox et al. | 382/145 |

FOREIGN PATENT DOCUMENTS

| | | |
|---|---|---|
| JP | 2003229568 A | 8/2003 |
| JP | 2005129930 A | 5/2005 |
| WO | WO-2005104265 | 11/2005 |

OTHER PUBLICATIONS

Brown et al., "Multi-aperture Beam Integration Systems", Laser Beam Shaping, Chap 7, pp. 273-311, Ed. Dickey, Holswade (2000).

Dorotek, "Beam Splitters", http://www.dorotek.de/cms/upload/pdf/optik/englisch/7Beam_splitters.pdf, pp. 1-6.

Felch, "Sub-Melt Laser Annealing Followed by Low-Temperature RTP for Minimized Diffusion", 2000 International Conference on Ion Implantation Technology Proceedings, Alpbach, Austria, Sep. 17-22, 2000, pp. 167-170, IEEE 00EX432, ISBN 0-7803-6462-7.

Griot, "Beamsplitters: A Guide for Designers," The Photonics Design and Applications Handbook, 2002, http://www.mellesgriot.com/pdf/P_Handbook_Beamsplitters.pdf, pp. H-309-H-314.

Liang, et al., "Ultrashort Laser-Pulse Annealing of Hydrogenated Amorphous Silicon", Applied Physics, A 26, pp. 39-43, Springer-Verlag, Germany, 1981.

Lin et al., "Characterization of Excimer Lasers for Application to Lenslet Array Homogenizers", Optical Society of America, Applied Optics, vol. 40, No. 12, Apr. 2001, pp. 1931-1941.

Pate, "Fly's Eye Arrays for Uniform Illumination in Digital Projector Optics", ZEMAX Digital Projection Optics, Apr. 2006, 7 pages.

Rudge et al., "Fly's-Eye Lens Technique for Generating Semiconductor Device Fabrication Masks", IBM Journal Apr. 1963, pp. 146-150.

First Office Action dated Mar. 5, 2010 for Chinese Patent Application No. 200780008142.0.

International Search Report and Written Opinion of the Inernational Searching Authority, mailed Feb. 26, 2008 (PCT/US07/62672).

Notice of Allowance dated Mar. 24, 2009 for U.S. Appl. No. 11/459,847.

Office Action dated Jul. 2, 2008 for U.S. Appl. No. 11/459,847.

Office Action dated Nov. 19, 2008 for U.S. Appl. No. 11/459,847.

Office Action dated Dec. 8, 2009 for U.S. Appl. No. 11/459,852.

Office Action dated Jun. 24, 2010 for U.S. Appl. No. 11/459,852.

Office Action for Korean Patent Application No. 10-2008-7024646 dated Aug. 26, 2010.

Notice to File a Response dated Dec. 18, 2012 for Korean Patent Application No. 2010-7024018.

Office Action dated Apr. 25, 2013 for U.S. Appl. No. 12/855,652.

* cited by examiner

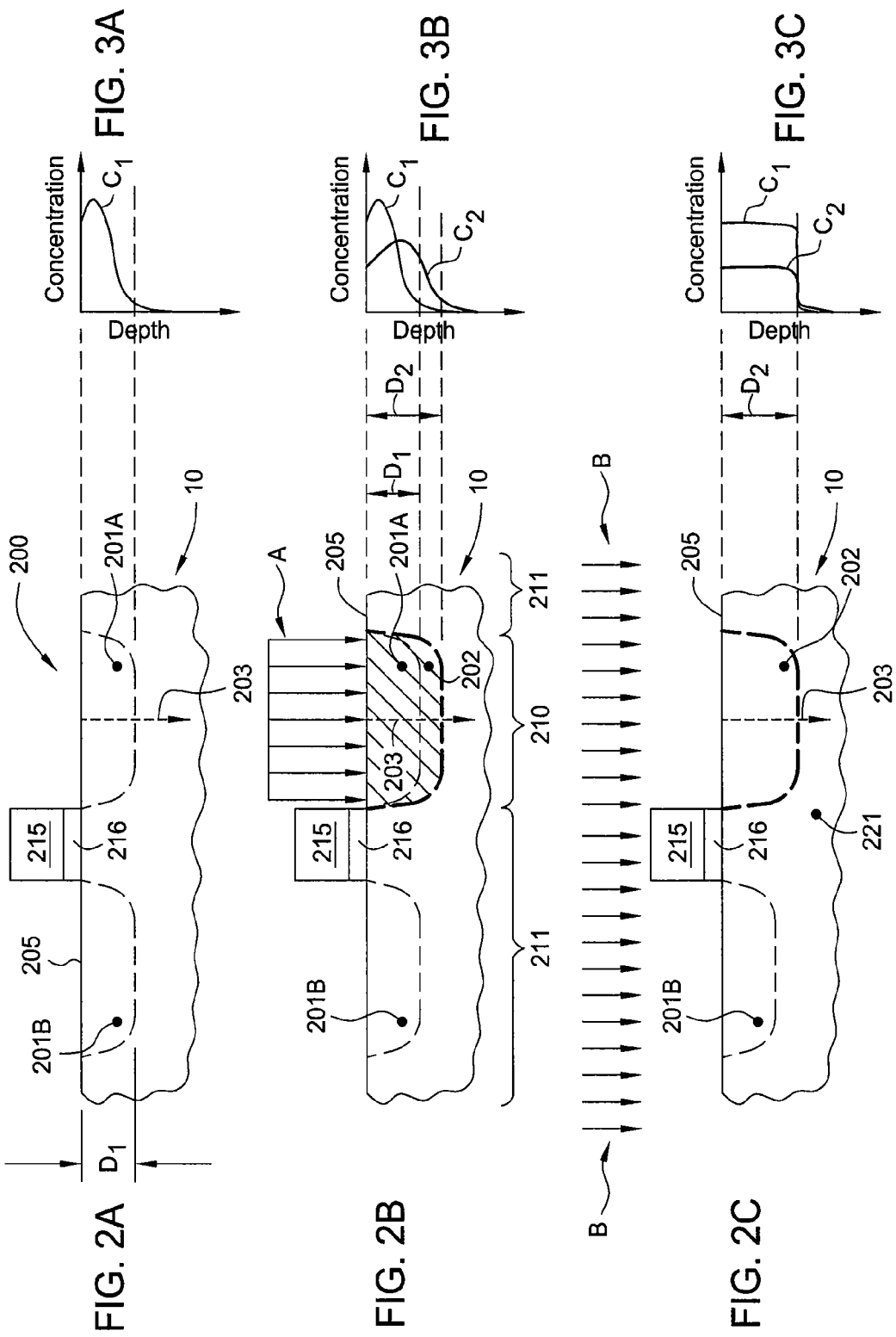

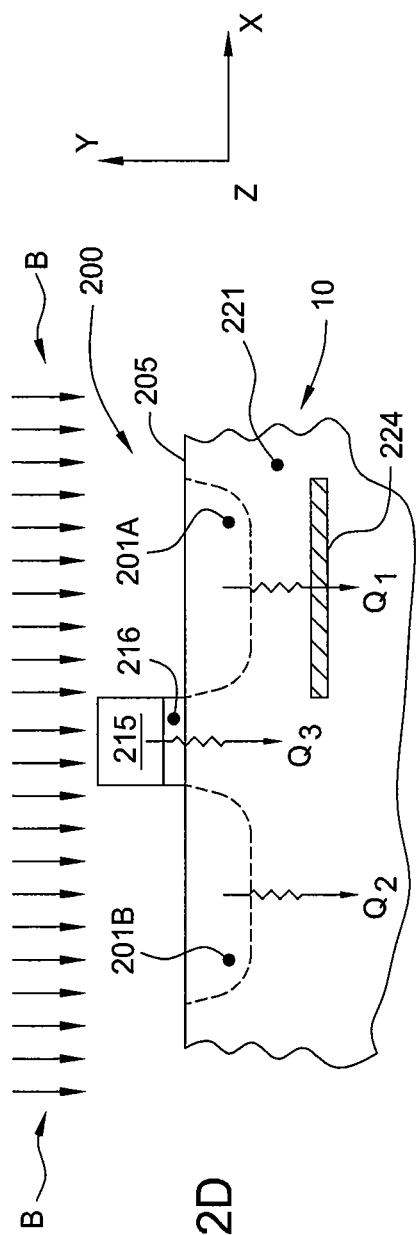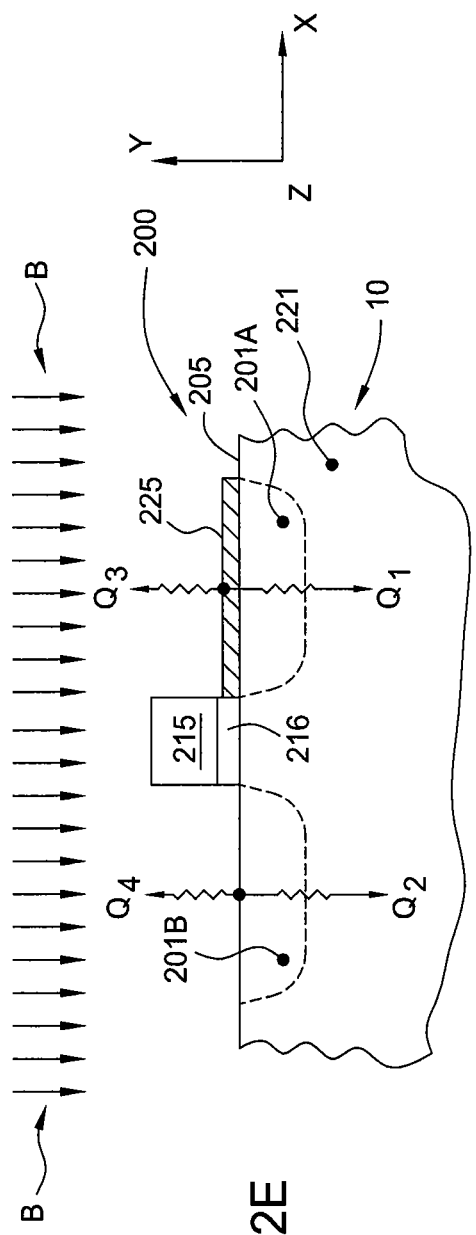
FIG. 2D
FIG. 2E

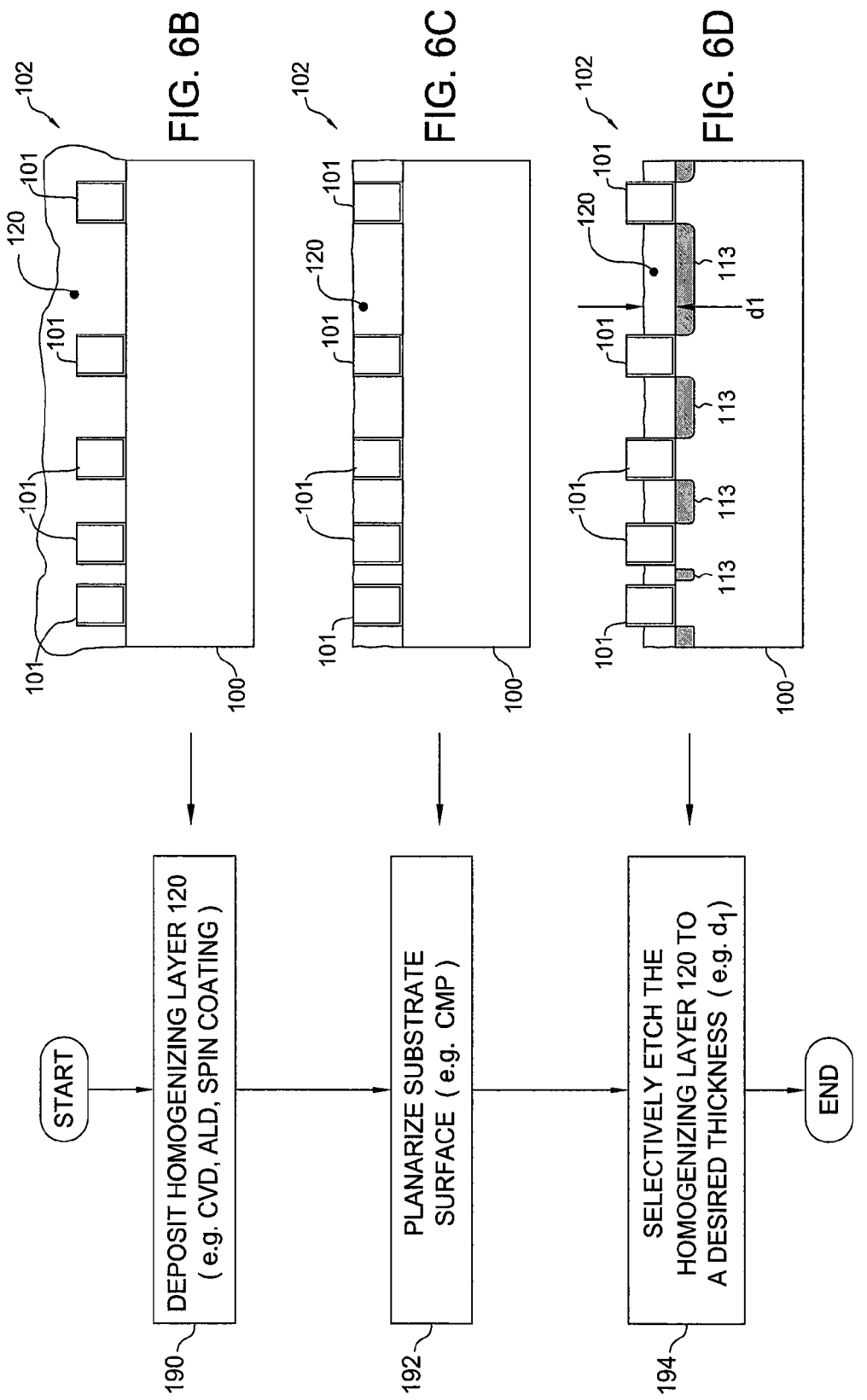

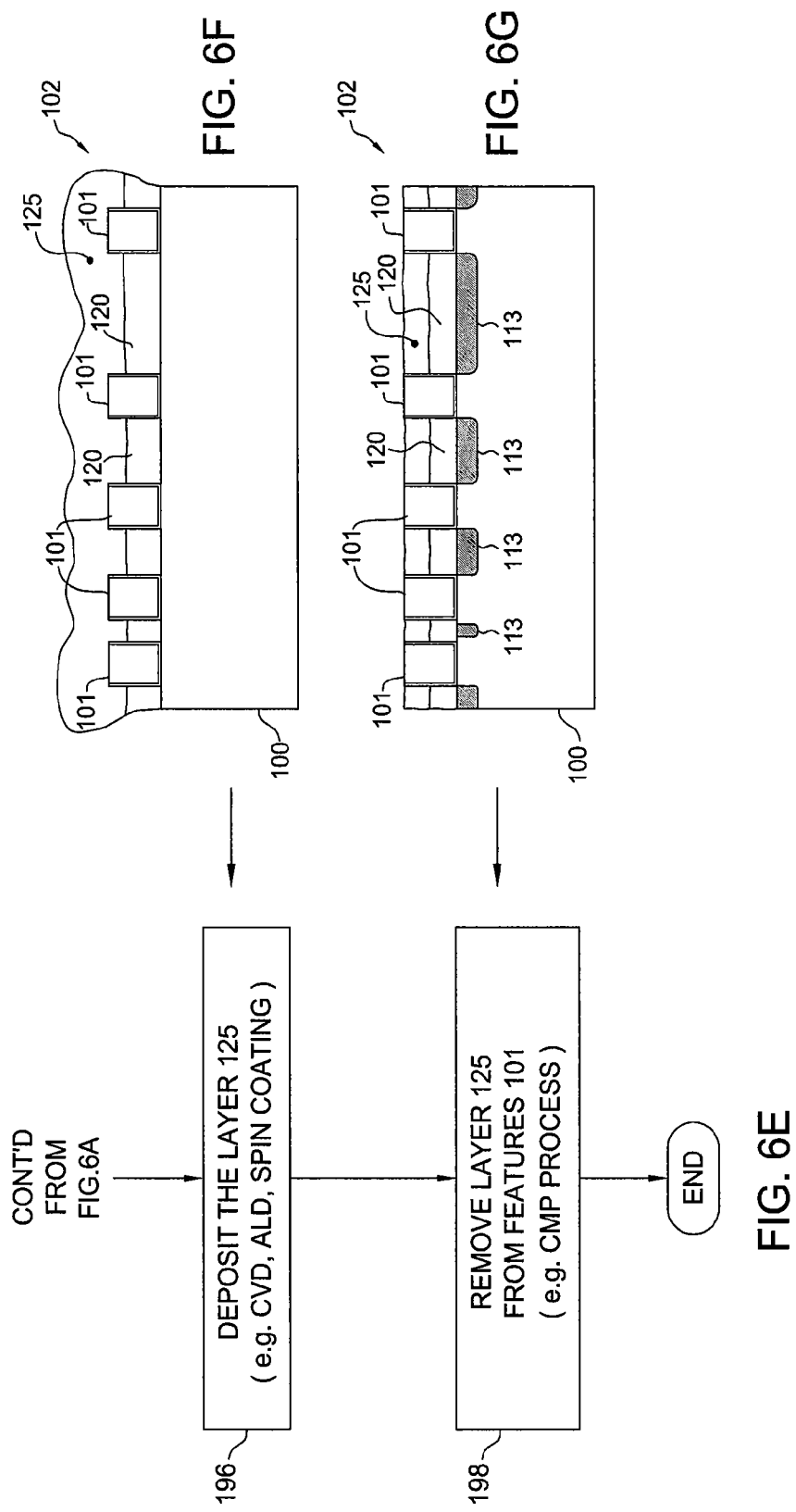

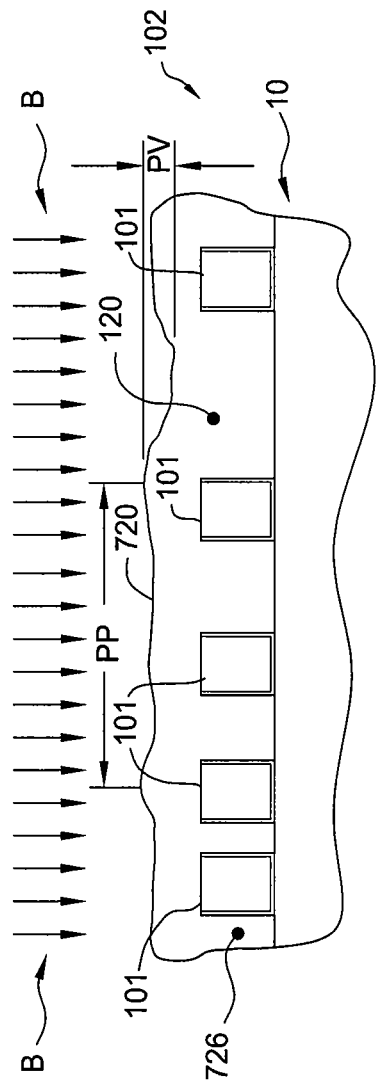
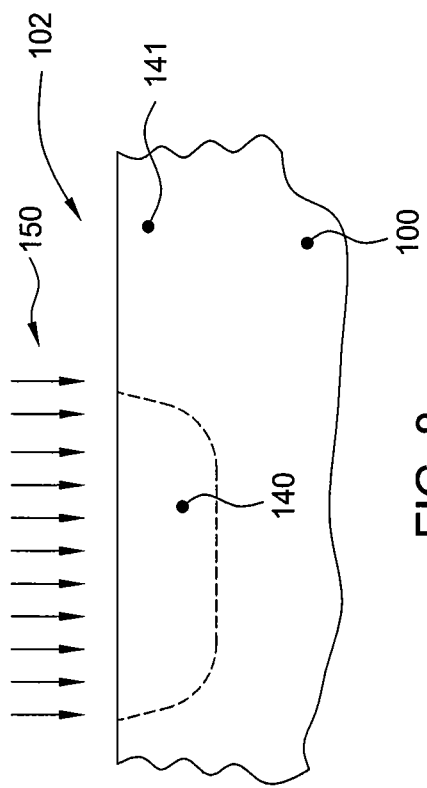

METHOD OF THERMAL PROCESSING STRUCTURES FORMED ON A SUBSTRATE

CROSS-REFERENCE TO RELATED APPLICATIONS

This application is a continuation of co-pending U.S. patent application Ser. No. 12/855,652, filed Aug. 12, 2010, which is a continuation of U.S. patent application Ser. No. 11/459,856, filed Jul. 25, 2006, which claims benefit U.S. Provisional Patent Application Ser. No. 60/780,745, filed Mar. 8, 2006, which are herein incorporated by reference.

This application is related to U.S. patent application Ser. No. 11/459,847, filed Jul. 25, 2006, and issued Aug. 4, 2009, as U.S. Pat. No. 7,569,463, and to U.S. patent application Ser. No. 11/459,852, filed Jul. 25, 2006, and published Sep. 27, 2007, as United States Patent Publication 2007/0221640.

BACKGROUND OF THE INVENTION

1. Field of the Invention

Embodiments of the present invention generally relate to a method of manufacturing a semiconductor device. More particularly, the invention is directed to a method of thermally processing a substrate.

2. Description of the Related Art

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber.

During such single wafer processing the wafer is typically heated to high temperatures so that various chemical and physical reactions can take place in multiple IC devices defined in the wafer. Of particular interest, favorable electrical performance of the IC devices requires implanted regions to be annealed. Annealing recreates a more crystalline structure from regions of the wafer that were previously made amorphous, and activates dopants by incorporating their atoms into the crystalline lattice of the substrate, or wafer. Thermal processes, such as annealing, require providing a relatively large amount of thermal energy to the wafer in a short amount of time, and thereafter rapidly cooling the wafer to terminate the thermal process. Examples of thermal processes currently in use include Rapid Thermal Processing (RTP) and impulse (spike) annealing. While such processes are widely used, current technology is not ideal. It tends to ramp the temperature of the wafer too slowly and expose the wafer to elevated temperatures for too long. These problems become more severe with increasing wafer sizes, increasing switching speeds, and/or decreasing feature sizes.

In general, these thermal processes heat the substrates under controlled conditions according to a predetermined thermal recipe. These thermal recipes fundamentally consist of a temperature that the semiconductor substrate must be heated to, the rate of change of temperature, i.e., the temperature ramp-up and ramp-down rates and the time that the thermal processing system remains at a particular temperature. For example, thermal recipes may require the substrate to be heated from room temperature to distinct temperatures of 1200° C. or more, for processing times at each distinct temperature ranging up to 60 seconds, or more.

Moreover, to meet certain objectives, such as minimal inter-diffusion of materials between different regions of a semiconductor substrate, the amount of time that each semiconductor substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible.

The requirement for high temperature ramp rates led to the development of Rapid Thermal Processing (RTP), where typical temperature ramp-up rates range from 200 to 400° C./s, as compared to 5-15° C./minute for conventional furnaces. Typical ramp-down rates are in the range of 80-150° C./s. A drawback of RTP is that it heats the entire wafer even though the IC devices reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate.

To resolve some of the problems raised in conventional RTP type processes various scanning laser anneal techniques have been used to anneal the surface(s) of the substrate. In general, these techniques deliver a constant energy flux to a small region on the surface of the substrate while the substrate is translated, or scanned, relative to the energy delivered to the small region. Due to the stringent uniformity requirements and the complexity of minimizing the overlap of scanned regions across the substrate surface these types of processes are not effective for thermal processing contact level devices formed on the surface of the substrate.

In view of the above, there is a need for an method for annealing a semiconductor substrate with high ramp-up and ramp-down rates. This will offer greater control over the fabrication of smaller devices leading to increased performance.

SUMMARY OF THE INVENTION

The present invention generally provide a method of thermally processing a substrate, comprising positioning a substrate on a substrate support, and delivering a plurality of electromagnetic energy pulses to first area on a surface of a substrate that is in thermal communication with a first region of the substrate, wherein delivering a plurality of electromagnetic energy pulses comprises delivering a first pulse of electromagnetic energy to the surface of the substrate, delivering a second pulse of electromagnetic energy to the surface of the substrate, and adjusting the time between the start of the first pulse and the start of the second pulse so that the material contained in the first region melts.

Embodiments of the invention further provide a method of thermally processing a substrate, comprising positioning a substrate on a substrate support; and delivering electromagnetic energy to a surface of a substrate that is in thermal communication with a first region and a second region of the substrate, wherein delivering electromagnetic energy comprises delivering a first amount of electromagnetic energy at a first wavelength to preferentially melt a material contained in the first region rather than the second region, and delivering a second amount of electromagnetic energy at a second wavelength to preferentially melt the material contained in the first region rather than the second region, wherein the delivering a second amount of electromagnetic energy and the delivering a first amount of electromagnetic energy overlap in time.

Embodiments of the invention further provide a method of thermally processing a substrate, comprising positioning a substrate on a substrate support, delivering electromagnetic energy to a first area on a surface of a substrate that is in thermal communication with a first region and a second region of the substrate, wherein delivering electromagnetic energy comprises delivering a first amount of electromagnetic energy at a first wavelength to preferentially melt a material contained in the first region rather than the second region, and delivering a second amount of electromagnetic energy at a first wavelength to preferentially melt the material contained in the first region rather than the second region after the first amount of electromagnetic energy, and delivering electromagnetic energy to a second area on the surface of the substrate that is in thermal communication with a third region and a fourth region of the substrate, wherein the second area is generally adjacent to the first area and delivering electromagnetic energy comprises delivering a first amount of electromagnetic energy at a first wavelength to preferentially melt a material contained in the third region rather than the fourth region, and delivering a second amount of electromagnetic energy at a first wavelength to preferentially melt the material contained in the third region rather than the fourth region after the first amount of electromagnetic energy.

Embodiments of the invention further provide a method of thermally processing a substrate, comprising delivering an amount of electromagnetic energy to a first area on a surface of a substrate to cause a material in one or more regions within the first area to melt, and delivering an amount of electromagnetic energy to a second area on the surface of the substrate to cause a material in one or more regions within the second area to melt, wherein the first area and the second area on the surface of the substrate are generally adjacent to each other.

Embodiments of the invention further provide a method of thermally processing a substrate, comprising positioning a substrate on a substrate support, and delivering electromagnetic energy to a surface of a substrate that is in thermal communication with a first region and second region of the substrate, wherein delivering electromagnetic energy comprises adjusting the shape of a pulse of electromagnetic energy as a function of time to preferentially melt the material contained in the first region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2F illustrate a schematic side view of a region on a surface of a substrate described within an embodiment herein;

FIG. 3A illustrate a graph of concentration versus depth into a region of a substrate illustrated in FIG. 2A that is within an embodiment herein;

FIG. 3B illustrate a graph of concentration versus depth into a region of a substrate illustrated in FIG. 2B that is within an embodiment herein;

FIG. 3C illustrate a graph of concentration versus depth into a region of a substrate illustrated in FIG. 2C that is within an embodiment herein;

FIG. 6A illustrate methods of forming one or more desired layers on a surface of the substrate described within an embodiment contained herein;

FIGS. 6B-6D illustrate schematic side views of a region of a substrate described in conjunction with the method illustrated in FIG. 6A that is within an embodiment described herein;

FIG. 6E illustrate methods of forming one or more desired layers on a surface of the substrate described within an embodiment contained herein;

FIGS. 6F-6G illustrate schematic side views of a region of a substrate described in conjunction with the method illustrated in FIG. 6E that is within an embodiment described herein;

FIG. 7 illustrates a schematic side view of a region on the surface of a substrate described within an embodiment herein;

FIG. 8 illustrates a schematic side view of a region on the surface of a substrate described within an embodiment herein;

DETAILED DESCRIPTION

Figure 1:
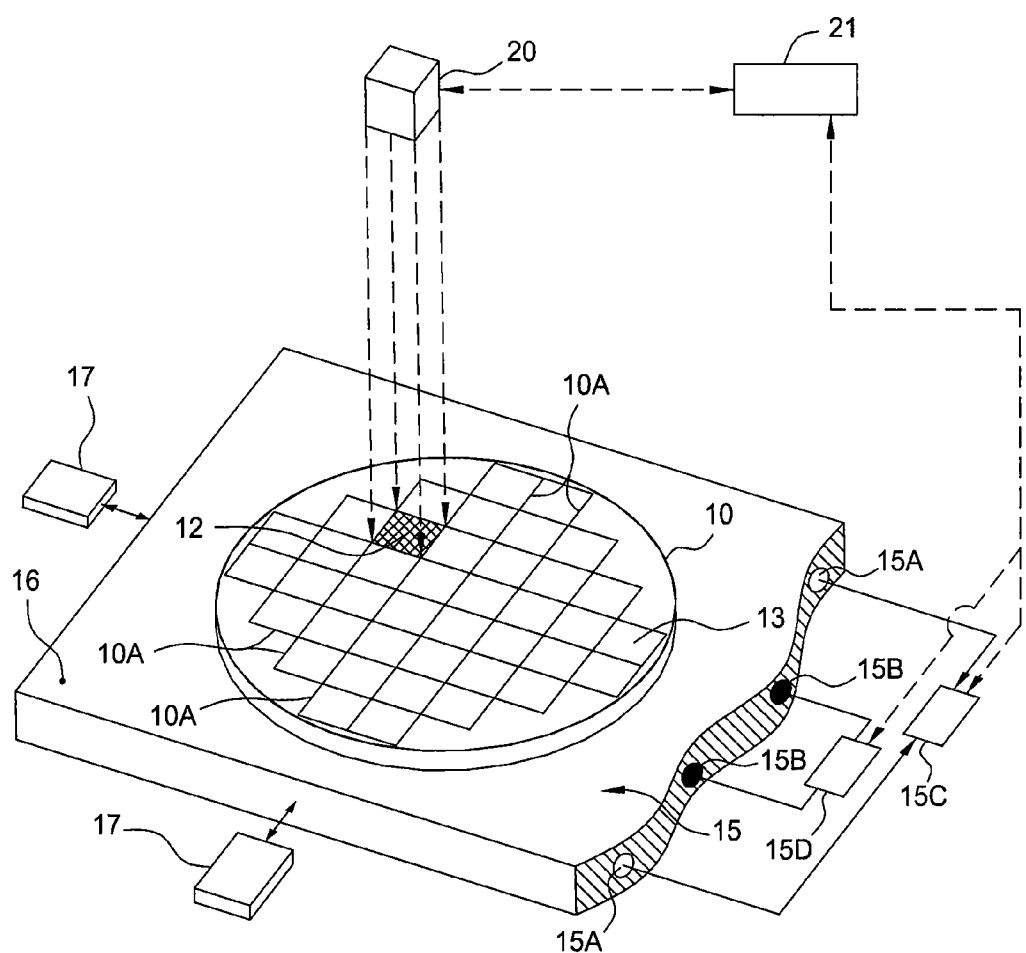
FIG. 1 illustrates an isometric view of an energy source that is adapted to project an amount of energy on a defined region of the substrate described within an embodiment herein.

The present invention generally improves the performance of the implant anneal steps used in the process of manufacturing a semiconductor devices on a substrate. Generally, the methods of the present invention may be used to preferentially anneal selected regions of a substrate by delivering enough energy to the selected regions to cause them to re-melt and solidify.

In general the term "substrates" as used herein can be formed from any material that has some natural electrical conducting ability or a material that can be modified to provide the ability to conduct electricity. Typical substrate materials include, but are not limited to semiconductors, such as silicon (Si) and germanium (Ge), as well as other compounds that exhibit semiconducting properties. Such semiconductor compounds generally include group III-V and group II-VI compounds. Representative group III-V semiconductor compounds include, but are not limited to, gallium arsenide (GaAs), gallium phosphide (GaP), and gallium nitride (GaN). Generally, the term semiconductor substrates include bulk semiconductor substrates as well as substrates having deposited layers disposed thereon. To this end, the deposited layers in some semiconductor substrates processed by the methods of the present invention are formed by either homoepitaxial (e.g., silicon on silicon) or heteroepitaxial (e.g., GaAs on silicon) growth. For example, the methods of the present invention may be used with gallium arsenide and gallium nitride substrates formed by heteroepitaxial methods. Similarly, the invented methods can also be applied to form integrated devices, such as thin-film transistors (TFTs), on relatively thin crystalline silicon layers formed on insulating substrates (e.g., silicon-on-insulator [SOI] substrates).

In one embodiment of the invention, an amount of energy is delivered to the surface of the substrate to preferentially melt certain desired regions of the substrate to remove unwanted damage created from prior processing steps (e.g., crystal damage from implant processes), more evenly distribute dopants in various regions of the substrate, and/or activate various regions of the substrate. The preferential melting processes will allow more uniform distribution of the dopants in the melted region, due to the increased diffusion rate and solubility of the dopant atoms in the moltent region of the substrate. The creation of a melted region thus allows: 1) the dopant atoms to redistribute more uniformly, 2) defects created in prior processing steps to be removed, and 3) regions that have hyper-abrupt dopant concentrations to be formed. The gradient in dopant concentration in a region that has a hyper-abrupt dopant concentrations is very large (e.g., <2 nm/decade of concentration) as the concentration rapidly changes from one region to another in the device.

Use of the techniques described herein allows junctions to be formed that contain higher dopant concentrations than conventional devices, since the common negative attributes of the formed junctions, such as an increase in the concentration of defects in the substrate material by the increase in doping level, can be easily reduced to an acceptable level by use of the processing techniques described herein. The higher dopant levels and abrupt changes in the dopant concentration can thus increase the conductivity of various regions of the substrate, thus improving device speed without negatively affecting device yield, while minimizing the diffusion of dopants into various regions of the substrate. The resultant higher dopant concentration increases the conductivity of the formed device and improves its performance. Typically, devices that are formed using an RTP process, will not use a dopant concentration greater than about $1 \times 10^{15}$ atoms/cm$^2$, since the higher dopant concentrations cannot readily diffuse into the bulk material of the substrate during typical RTP processes and will instead result in clusters of dopant atoms and other types of defects. Using one or more of the embodiments of the anneal process described herein, much more dopant (up to 5-10 times more dopant, i.e., $1 \times 10^{16}$ atoms/cm$^2$) may be successfully incorporated into the desired substrate surface, since regions of the substrate are preferentially melted so that the dopants will become more evenly distributed throughout the liquid before the liquefied regions solidify.

FIG. 1 illustrates an isometric view of one embodiment of the invention where an energy source 20 is adapted to project an amount of energy on a defined region, or a anneal region 12, of the substrate 10 to preferentially melt certain desired regions within the anneal region 12. In one example, as shown in FIG. 1, only one or more defined regions of the substrate, such as anneal region 12, are exposed to the radiation from the energy source 20 at any given time. In one aspect of the invention, multiple areas of the substrate 10 are sequentially exposed to a desired amount of energy delivered from the energy source 20 to cause the preferential melting of desired regions of the substrate. In general, the areas on the surface of the substrate may be sequentially exposed by translating the substrate relative to the output of the electromagnetic radiation source (e.g., conventional X/Y stage, precision stages) and/or translating the output of the radiation source relative to the substrate. Typically, one or more conventional electrical actuators 17 (e.g., linear motor, lead screw and servo motor), which may be part of a separate precision stage (not shown), are used to control the movement and position of substrate 10. Conventional precision stages that may be used to support and position the substrate 10, and heat exchanging device 15, may be purchased from Parker Hannifin Corporation, of Rohnert Park, Calif.

In one aspect, the anneal region 12 is sized to match the size of the die 13 (e.g., 40 "die" are shown in FIG. 1), or semiconductor devices (e.g., memory chip), that are formed on the surface of the substrate. In one aspect, the boundary of the anneal region 12 is aligned and sized to fit within the "kurf" or "scribe" lines 10A that define the boundary of each die 13. In one embodiment, prior to performing the annealing process the substrate is aligned to the output of the energy source 20 using alignment marks typically found on the surface of the substrate and other conventional techniques so that the anneal region 12 can be adequately aligned to the die 13. Sequentially placing anneal regions 12 so that they only overlap in the naturally occurring unused space/boundaries between die 13, such as the scribe or kurf lines, reduces the need to overlap the energy in the areas where the devices are formed on the substrate and thus reduces the variation in the process results between the overlapping anneal regions. This technique has advantages over conventional processes that sweep the laser energy across the surface of the substrate, since the need to tightly control the overlap between adjacently scanned regions to assure uniform annealing across the desired regions of the substrate is not an issue due to the confinement of the overlap to the unused space between die 13. Confining the overlap to the unused space/boundary between die 13 also improves process uniformity results versus conventional scanning anneal type methods that utilize adjacent overlapping regions that traverse all areas of the substrate. Therefore, the amount of process variation, due to the varying amounts of exposure to the energy delivered from the energy source 20 to process critical regions of the substrate is minimized, since any overlap of delivered energy between the sequentially placed anneal regions 12 can be minimized. In one example, each of the sequentially placed anneal regions 12 are a rectangular region that is about 22 mm by about 33 mm in size (e.g., area of 726 square millimeters (mm$^2$)). In one aspect, the area of each of the sequentially placed anneal regions 12 formed on the surface of the substrate is between about 4 mm$^2$ (e.g., 2 mm×2 mm) and about 1000 mm$^2$ (e.g., 25 mm×40 mm).

The energy source 20 is generally adapted to deliver electromagnetic energy to preferentially melt certain desired regions of the substrate surface. Typical sources of electromagnetic energy include, but are not limited to an optical radiation source (e.g., laser), an electron beam source, an ion beam source, and/or a microwave energy source. In one aspect, the substrate 10 is exposed to a pulse of energy from a laser that emits radiation at one or more appropriate wavelengths for a desired period of time. In one aspect, pulse of energy from the energy source 20 is tailored so that the amount of energy delivered across the anneal region 12 and/or the amount of energy delivered over the period of the pulse is optimized to enhance preferential melting of certain desired areas. In one aspect, the wavelength of the laser is tuned so that a significant portion of the radiation is absorbed by a silicon layer disposed on the substrate 10. For laser anneal process performed on a silicon containing substrate, the wavelength of the radiation is typically less than about 800 nm, and can be delivered at deep ultraviolet (UV), infrared (IR) or other desirable wavelengths. In one embodiment, the energy source 20 is an intense light source, such as a laser, that is adapted to deliver radiation at a wavelength between about 500 nm and about 11 micrometers. In either case, the anneal process generally takes place on a given region of the substrate for a relatively short time, such as on the order of about one second or less.

In one aspect, the amount of energy delivered to the surface of the substrate is configured so that the melt depth does not extend beyond the amorphous depth defined by the amorphization implant step. Deeper melt depths facilitate the diffusion of dopant from the doped amorphous layers into the undoped molten layers. Such undesirable diffusion would sharply and deleteriously alter the electrical characteristics of the circuits on the semiconductor substrate. In some anneal processes, energy is delivered to the surface of a substrate for a very short time in order to melt the surface of the substrate to a sharply defined depth, for example less than 0.5 micrometers. The exact depth is determined by the size of the electronic device being manufactured.

Temperature Control of the Substrate During the Anneal Process

In one embodiment, it may be desirable to control the temperature of the thermally substrate during thermal processing by placing a surface of the substrate 10, illustrated in FIG. 1, in thermal contact with a substrate supporting surface 16 of a heat exchanging device 15. The heat exchanging device 15 is generally adapted to heat and/or cool the substrate prior to or during the annealing process. In this configuration, the heat exchanging device 15, such as a conventional substrate heater available from Applied Materials Inc., Santa Clara, Calif., may be used to improve the post-processing properties of the annealed regions of the substrate. In general, the substrate 10 is placed within an enclosed processing environment (not shown) of a processing chamber (not shown) that contains the heat exchanging device 15. The processing environment within which the substrate resides during processing may be evacuated or contain an inert gas that has a low partial pressure of undesirable gases during processing, such as oxygen.

In one embodiment, the substrate may be preheated prior to performing the annealing process so that the energy required to reach the melting temperature is minimized, which may reduce any induced stress due to the rapid heating and cooling of the substrate and also possibly reduce the defect density in the resolidified areas of the substrate. In one aspect, the heat exchanging device 15 contains resistive heating elements 15A and a temperature controller 15C that are adapted to heat a substrate disposed on a substrate supporting surface 16. The temperature controller 15C is in communication with the controller 21 (discussed below). In one aspect, it may be desirable to preheat the substrate to a temperature between about 20° C. and about 750° C. In one aspect, where the substrate is formed from a silicon containing material it may be desirable to preheat the substrate to a temperature between about 20° C. and about 500° C.

In another embodiment, it may be desirable to cool the substrate during processing to reduce any interdiffusion due to the energy added to substrate during the annealing process and/or increase the regrowth velocity after melting to increase the amorphization of the various regions during processing, such as described in conjunction with FIG. 8. In one configuration, the heat exchanging device 15 contains one or more fluid channels 15B and a cryogenic chiller 15D that are adapted to cool a substrate disposed on a substrate supporting surface 16. In one aspect, a conventional cryogenic chiller 15D, which is in communication with the controller 21, is adapted to deliver a cooling fluid through the one or more fluid channels 15B. In one aspect, it may be desirable to cool the substrate to a temperature between about −240° C. and about 20° C.

The controller 21 (FIG. 1) is generally designed to facilitate the control and automation of the thermal processing techniques described herein and typically may includes a central processing unit (CPU) (not shown), memory (not shown), and support circuits (or I/O) (not shown). The CPU may be one of any form of computer processors that are used in industrial settings for controlling various processes and hardware (e.g., conventional electromagnetic radiation detectors, motors, laser hardware) and monitor the processes (e.g., substrate temperature, substrate support temperature, amount of energy from the pulsed laser, detector signal). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. Preferably, the program is software readable by the controller and includes code to monitor and control the substrate position, the amount of energy delivered in each electromagnetic pulse, the timing of one or more electromagnetic pulses, the intensity and wavelength as a function of time for each pulse, the temperature of various regions of the substrate, and any combination thereof.

Selective Melting

In an effort to minimize inter-diffusion between various regions of a formed device, remove defects in the substrate material, and more evenly distribute dopants in various regions of the substrate, one or more processing steps are performed on various regions of the substrate to cause them to preferentially remelt when exposed to energy delivered from an energy source during the anneal process. The process of modifying the properties of a first region of the substrate so that it will preferentially melt rather than a second region of the substrate, when they are both exposed to about the same amount energy during the annealing process, is hereafter described as creating a melting point contrast between these two regions. In general, the substrate properties that can be modified to allow preferential melting of desired regions of the substrate include implanting, driving-in and/or co-depositing one or more elements within a desired regions of the substrate, creating physical damage to desired regions of the substrate, and optimizing the formed device structure to create the melting point contrast in desired regions of the substrate. Each of these modification processes will be reviewed in turn.

Figure 2F:
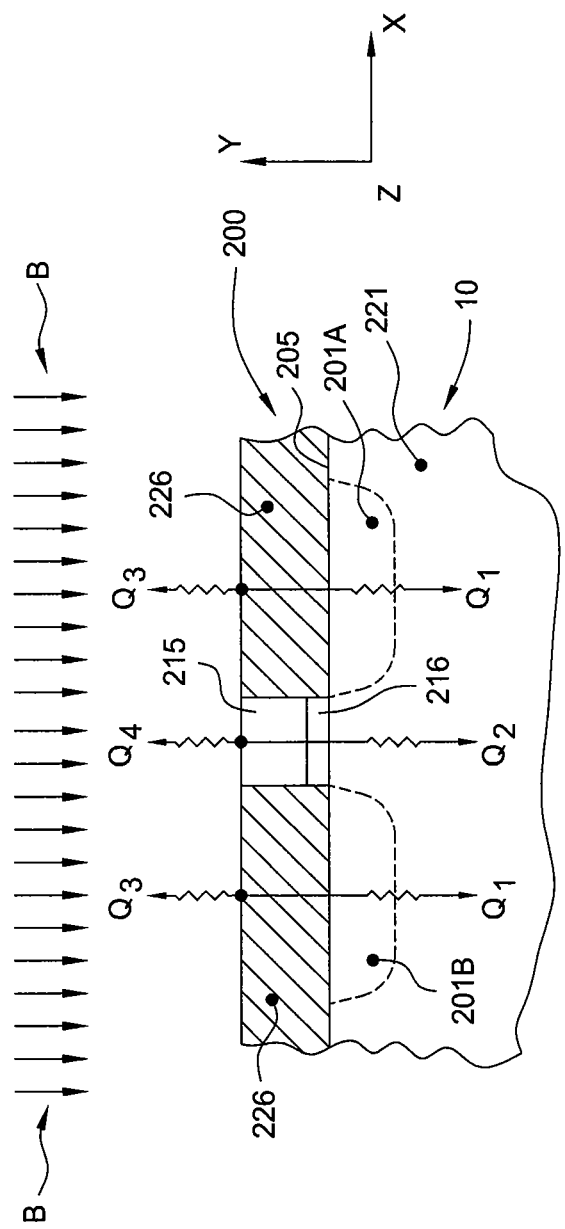

FIGS. 2A-2C illustrate cross-sectional views of an electronic device 200 at different stages of a device fabrication sequence incorporating one embodiment of the invention. FIG. 2A illustrates a side view of typical electronic device 200 formed on a surface 205 of a substrate 10 that has two doped regions 201 (e.g., doped regions 201A-201B), such as a source and drain region of a MOS device, a gate 215, and a gate oxide layer 216. The doped regions 201A-201B are generally formed by implanting a desired dopant material into the surface 205 of the substrate 10. In general, typical n-type dopants (donor type species) may include arsenic (As), phosphorus (P), and antimony (Sb), and typical p-type dopants (acceptor type species) may include boron (B), aluminum (Al), and indium (In) that are introduced into the semiconductor substrate 10 to form the doped regions 201A-201B. FIG. 3A illustrates an example of the concentration of the dopant material as a function of depth (e.g., curve $C_1$), from the surface 205 and into the substrate 10 along a path 203 extending through the doped region 201A. The doped region 201A has a junction depth $D_1$ after the implant process, which may be defined as a point where the dopant concentration drops off to a negligible amount. It should be noted that FIGS. 2A-2F are only intended to illustrate some of the various aspects of the invention and is not intended to be limiting as to the type of device, type of structure, or regions of a device that may be formed using the various embodiments of the invention described herein. In one example, the doped regions 201 (e.g., source or drain regions in a MOS device) can be a raised or lowered relative to the position of the gate 215 (e.g., gate in a MOS device) without varying from the scope of the invention described herein. As semiconductor device sizes decrease the position and geometry of structural elements of the electronic devices 200 formed on the surface 205 of a substrate 10 may vary to improve device manufacturability or device performance. It should also be noted that the modification of only a single doped region 201A, as shown in FIGS. 2A-2E, is not intended to be limiting as to the scope of the invention described herein and is only meant to illustrate how embodiments of the invention can be used to manufacture a semiconductor device.

FIG. 2B illustrates a side view of the electronic device 200 shown in FIG. 2A during a process step that is adapted to selectively modify the properties of a discrete region (e.g., modified area 210) of the substrate 10, which in this case is a region containing a single doped region 201A, to create a melting point contrast. After performing the modification process a melting point contrast will be created between the modified area 210 and unmodified areas 211. In one embodiment, the modification process includes the step(s) of adding a material to a layer as it is being deposited on the surface of the substrate, where the incorporated material is adapted to form an alloy with the substrate material to lower the melting point of a region 202 within the modified area 210. In one aspect, the incorporated material is added to the deposited layer during an epitaxial layer deposition process.

In another embodiment, the modification process includes the step of implanting (see "A" in FIG. 2B) a material that is adapted to form an alloy with the substrate material to lower the melting point of a region 202 within the modified area 210. In one aspect, the modification process is adapted to implant the alloying material to a depth $D_2$, as shown in FIG. 2B. FIG. 3B illustrates an example of the concentration of the dopant material (e.g., curve $C_1$) and implanted alloying material (e.g., curve $C_2$) as a function of depth, from the surface 205 and through the substrate 10 along a path 203. In one aspect, where the substrate 10 is formed from a silicon containing material and the implanted alloying materials that may be used include, for example, germanium (Ge), arsenic (As), gallium (Ga), carbon (C), tin (Sn), and antimony (Sb). In general, the alloying material can be any material that when heated in the presence of the substrate base material causes the melting point of the region 202 in the modified area 210 to be lowered relative to the unmodified areas 211. In one aspect, a region of a silicon substrate is modified by the addition of between about 1% and about 20% of germanium to reduce the melting point between the modified and un-modified area. It is believed that the addition of germanium in these concentrations will lower the melting point of the modified areas versus the un-modified areas by about 300° C. In one aspect, the region 202 formed in a silicon substrate contains germanium (Ge) and carbon (C), so that a $Si_xGe_yC_z$ alloy will form to lower the melting point of the region 202 relative to the unmodified areas 211. In another aspect, a region of a silicon substrate is modified by the addition of about 1% or less of arsenic to reduce the melting point between the modified and un-modified area.

In another embodiment, the modification process includes the step of inducing some damage to the substrate 10 material in the various modified areas (e.g., modified area 210) to damage the crystal structure of the substrate, and thus make these regions more amorphous. Inducing damage to the crystal structure of the substrate, such as damaging a single crystal silicon substrate, will reduce the melting point of this region relative to an undamaged region due to the change in the bonding structure of atoms in the substrate and thus induce thermodynamic property differences between the two regions. In one aspect, damage to the modified area 210 in FIG. 2B is performed by bombarding the surface 205 of the substrate 10 (see "A" in FIG. 2B) with a projectile that can create damage to the surface of the substrate. In one aspect, the projectile is a silicon (Si) atom that is implanted into a silicon containing substrate to induce damage to the region 202 within the modified area 210. In another aspect, the damage to the substrate material is created by bombarding the surface with gas atoms, such as argon (Ar), krypton (Kr), xenon (Xe) or even nitrogen ($N_2$), using an implant process, an ion beam or biased plasma to induce damage to region 202 of the modified area 210. In one aspect, the modification process is adapted to create a region 202 that has induced damage to a depth $D_2$, as shown in FIG. 2B. It is believed that a dislocation or vacancy density of between about $5 \times 10^{14}$ and about $1 \times 10^{16}/cm^2$ may be useful to create the melting point contrast between a modified area 210 versus an unmodified area 211. In one aspect, FIG. 3B illustrates an example of the concentration of the dopant material (e.g., curve $C_1$) and defects density (e.g., curve $C_2$) as a function of depth, from the surface 205 and through the substrate 10 along a path 203.

It should be noted that while FIGS. 2A-2B illustrate a process sequence in which the modification process is performed after the doping process, this process sequence is not intended to be limiting as to the scope of the invention described herein. For example, in one embodiment, it is desirable to perform the modification process described in FIG. 2B prior to performing the doping process described in FIG. 2A.

FIG. 2C illustrates a side view of the electronic device 200 shown in FIG. 2B that is exposed to radiation "B" emitted from the an energy source, such as optical radiation from a laser. During this step the modified area(s) (e.g., modified area 210) and unmodified areas (e.g., 211) disposed across the substrate 10 are exposed to an amount of energy which causes the region 202 in the modified area(s) 210 to selectively melt and resolidify after the pulse of radiation "B" has been applied, while the unmodified areas 211 remain in a solid state. The amount of energy, the energy density and the duration that the radiation "B" is applied can be set to preferentially melt the regions 202 by knowing the desired depth of the region 202, the materials used to create the region 202, the other materials used to form the electronic device 200, and the heat transfer characteristics of the components within the formed electronic device 200. As shown in FIGS. 2C and 3C, upon exposure to the radiation "B" the remelting and solidification of the region 202 causes the concentration of the dopant atoms (e.g., curve $C_1$) and alloying atoms (e.g., curve $C_2$) is more uniformly redistributed in the region 202. Also, the dopant concentration between the region 202 and the substrate bulk material 221 has a sharply defined boundary (i.e., a "hyper-abrupt" junction) and thus minimizes the unwanted diffusion into the substrate bulk material 221. In the embodiment, discussed above, in which damage is induced into the substrate 10 to improve the melting point contrast the concentration of defects (e.g., curve $C_2$) after resolidification will preferably drop to a negligible level.

Thermal Isolation Techniques

In another embodiment, the various thermal properties of different regions of the formed device are tailored to preferentially cause the melting in one region versus another region. In one aspect, the melting point contrast is created by forming different regions of the device with materials that have different thermal conductivities (k). It should be noted that heat transferred by conduction is governed by the equation:

$$Q = kA\Delta T/\Delta x$$

in which Q is the time rate of heat flow through a body, k is the conductivity constant dependent on the nature of the material and the material temperature, A is the area through which the heat flows, Δx is the thickness of the body of matter through which the heat is passing, and ΔT is the temperature difference through which the heat is being transferred. Therefore, since k is a property of the material the selection or modification of the material in various regions of the substrate can allow one to control the heat flow into and out-of the different regions of the substrate to increase the melting point contrast for the various regions. In other words, where the material in a region of a substrate has a higher thermal conductivity than the material in other regions, it will lose more thermal energy via conductive losses during a laser anneal process, and, hence, will not reach the same temperatures that another region that has a lower thermal conductivity will reach. The regions in intimate contact with the higher thermally conductive regions can be prevented from melting, while other regions in intimate contact with lower thermal conductivity regions will reach their melting point during the laser anneal process. By controlling the thermal conductivity of the various regions of the electronic device 200 the melting point contrast can be increased. The creation of regions having varying thermal conductivities may be performed by performing conventional deposition, patterning and etching techniques in various underlying layers of the electronic device 200 to create these regions having different thermal conductivities. The underlying layers having differing thermal conductivities may be formed by use of conventional chemical vapor deposition (CVD) processes, atomic layer deposition (ALD) processes, implant processes, and epitaxial deposition techniques.

FIG. 2D illustrates a side view of the electronic device 200 that is has a buried region 224 that has a lower thermal conductivity than the substrate bulk material 221. In this case the radiation "B" emitted from an energy source, is absorbed at the surface 205 of the substrate and is conducted through the substrate 10, so that the heat flow ($Q_1$) in the region above (e.g., doped region 201A) the buried region 224 is less than the heat flow ($Q_2$) from an area that doesn't have the lower conductivity buried layer. Therefore, since the heat lost from the region above the buried region 224 is less than the other regions of the substrate, this area will reach a higher temperature than the other regions of the device. By controlling the amount of energy delivered by the energy source 20 the temperature in the regions above the buried layer can be raised to a level that will cause it to preferentially melt versus the other regions. In one aspect, the buried region 224 is made of an insulative material, such as a silicon dioxide ($SiO_2$), silicon nitride (SiN), germanium (Ge), gallium arsenide (GaAs), combinations thereof or derivatives thereof. So although the actual melting point of the substrate material in the region that is to be melted is not altered, there is still a quantifiable and repeatable contrast in thermal behavior from other regions of the substrate surface that allows it to be selectively melted. In another embodiment, the buried region 224 may have a higher conductivity than the substrate bulk material 221, which may then allow the areas that do not have the buried layer to preferentially melt versus the regions above the buried layer.

Modification of Surface Properties

In one embodiment, the properties of the surface over the various regions 202 of the substrate 10 are altered to change the melting point contrast between one or more desired regions. In one aspect, the emissivity of the surface of the substrate in a desired region is altered to change the amount of energy transferred from the substrate surface during processing. In this case, a region that has a lower emissivity than another region will achieve a higher processing temperature due to its inability to reradiate the absorbed energy received from the energy source 20. When performing an anneal process that involves the melting of the surface of a substrate, the processing temperatures achieved at the surface of the substrate can be quite high (e.g., ~1414° C. for silicon), and thus the effect of varying the emissivity can have a dramatic effect on the melting point contrast, since radiative heat transfer is the primary heat loss mechanism. Therefore, variations in the emissivity of different regions of the substrate surface may have a significant impact on the ultimate temperatures reached by the various regions of the substrate. Regions with low emissivity may be elevated above the melting point during the annealing process, while regions with high emissivity that have absorbed the same amount of energy may remain substantially below the melting point. Varying the emissivity of the various surfaces, or emissivity contrast, may be accomplished via selective deposition of a low- or high-emissivity coating onto the substrate surface, and/or modifying the surface of the substrate (e.g., surface oxidation, surface roughening).

In one embodiment, the reflectivity of the surface of the substrate in one or more regions is altered to change the amount of energy absorbed when the substrate 10 is exposed to energy from the energy source. By varying the reflectivity of the surface of the substrate the amount of energy absorbed and thus the maximum temperature achieved by the substrate in a region at and below the substrate surface will differ based on the reflectivity. In this case a surface having a lower reflectivity will more likely melt than another region that has a higher reflectivity. Varying the reflectivity of the surface of the substrate may be accomplished via selective deposition of a low- or high-reflectance coating onto the substrate surface, and/or modifying the surface of the substrate (e.g., surface oxidation, surface roughening). A highly absorbing (non-reflective) coating may be selectively applied to regions that are intended to be melted during the anneal process.

FIG. 2E illustrates one embodiment in which a coating 225 is selectively deposited, or uniformly deposited and then selectively removed, to leave a layer that has a different emissivity and/or reflectivity than the other regions on the surface 205 of the substrate 10. In this case the heat flow ($Q_1$) in the doped region 201A, below the coating 225, can be adjusted based on the properties of the coating versus the energy absorbed ($Q_2$) in other regions of the substrate. In this way the heat loss ($Q_3$) or reflected from the coating 225 can be varied versus the heat lost ($Q_4$) from the other regions. In one aspect, a carbon containing coating is deposited on the substrate surface by use of a CVD deposition process.

FIG. 2F illustrates one embodiment in which a coating 226 that alters the optical properties of the surface of the substrate (e.g., emissivity, reflectivity) is deposited over the surface of the substrate, for example over the device shown in FIG. 2A, and then an amount of material is removed to create regions that have differing optical properties. For example, as shown in FIG. 2F, the coating 226 has been removed from the surface of the gate 215, thus leaving the surface of the coating 226 and the surface 205 of the gate exposed to the incident radiation "B." In this case, the coating 226 and the surface 205 of the gate have different optical properties, such as a different emissivity and/or a different reflectivity. The removal process used to expose or create regions that have differing optical properties may be performed by use of a conventional material removal process, such as a wet etch or chemical mechanical polishing (CMP) process. In this case the absorption and heat flow ($Q_1$) in the doped regions 201A-201B, below the coating 226, can be adjusted based on the properties of the coating versus the absorption and heat flow ($Q_2$) in gate 215 region of the substrate. In this way the heat loss ($Q_3$) or reflected from the coating 226 can be varied versus the heat loss ($Q_4$) or reflected from the gate 215 region.

In one embodiment, the coating 226 contains one or more deposited layers of a desired thickness that either by themselves or in combination modify the optical properties (e.g., emissivity, absorbance, reflectivity) of various regions of the substrate that are exposed to one or more wavelengths of incident radiation. In one aspect, the coating 226 contains layers that either by themselves or in combination preferentially absorb or reflect one or more wavelengths of the incident radiation "B." In one embodiment, the coating 226 contains a dielectic material, such as fluorosilicate glass (FSG), amorphous carbon, silicon dioxide, silicon carbide, silicon carbon germanium alloys (SiCGe), nitrogen containing silicon carbide (SiCN), a BLOk™ dielectric material made by a process that is commercially available from Applied Materials, Inc., of Santa Clara, or a carbon containing coating that is deposited on the substrate surface by use of a chemical vapor deposition (CVD) process or atomic layer deposition process (ALD) process. In one aspect, coating 226 contains a metal, such as but not limited to titanium (Ti), titanium nitride (TiN), tantalum (Ta), cobalt (Co), or ruthenium (Ru).

It should be noted that one or more of the various embodiments, discussed herein, may be used in conjunction with each other in order to further increase process window. For example, a selectively deposited, light absorbing coating may be used in conjunction with doping of certain defined regions to broaden the process window of the anneal process.

Tuning the Energy Source Output to Achieve Preferential Melting

As noted above, the energy source 20 is generally adapted to deliver electromagnetic energy to preferentially melt certain desired regions of the substrate 10. Typical sources of electromagnetic energy include, but are not limited to an optical radiation source (e.g., laser (UV, IR, etc. wavelengths)), an electron beam source, an ion beam source, and/or a microwave energy source. In one embodiment of the invention, the energy source 20 is adapted to deliver optical radiation, such as a laser, to selectively heat desired regions of a substrate to the melting point.

In one aspect, the substrate 10 is exposed to a pulse of energy from a laser that emits radiation at one or more appropriate wavelengths, and the emitted radiation has a desired energy density ($W/cm^2$) and/or pulse duration to enhance preferential melting of certain desired regions. For laser annealing processes performed on a silicon containing substrate, the wavelength of the radiation is typically less than about 800 nm. In either case, the anneal process generally takes place on a given region of the substrate for a relatively short time, such as on the order of about one second or less. The desired wavelength and pulse profile used in an annealing process may be determined based on optical and thermal modeling of the laser anneal process in light of the material properties of the substrate.

FIGS. 4A-4D illustrate various embodiments in which the various attributes of the pulse of energy delivered from an energy source 20 to an anneal region 12 (FIG. 1) is adjusted as a function of time to achieve improved melting point contrast, and improve the anneal process results. In one embodiment, it is desirable to vary the shape of a laser pulse as a function of time, and/or vary the wavelengths of the delivered energy to enhance the heat input into regions of the substrate intended to be melted and minimize the heat input into other regions. In one aspect, it may also be desirable to vary the energy delivered to the substrate.

Figure 4A:
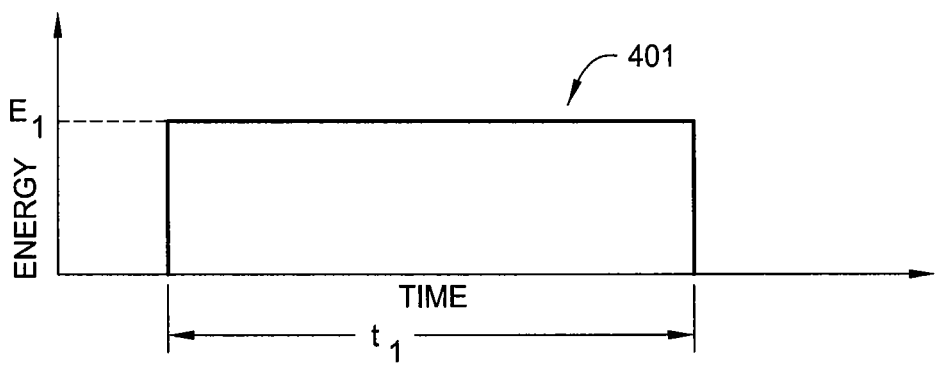
FIGS. 4A-4G schematic diagrams of electromagnetic energy pulses described within an embodiment herein.

FIG. 4A graphically illustrates a plot of delivered energy versus time of a single pulse of electromagnetic radiation (e.g., pulse 401) that may be delivered from the energy source 20 to the substrate 10 (see FIG. 1). The pulse illustrated in FIG. 4A is generally a rectangular pulse that delivers a constant amount of energy ($E_1$) for the complete pulse duration ($t_1$).

Figure 4B:
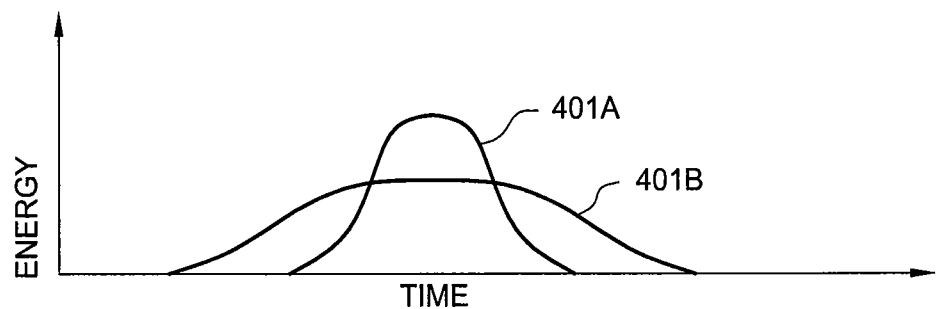

In one aspect, the shape of the pulse 401 may be varied as a function of time as it is delivered to the substrate 10. FIG. 4B graphically illustrates a plot of two pulses 401A, 401B of electromagnetic radiation that may be delivered from one energy source 20 to the substrate 10 that have a different shape. In this example, each pulse may contain the same total energy output, as represented by the area under each curve, but the effect of exposing regions of the substrate 10 to one pulse versus another pulse may improve the melting point contrast experienced during the anneal process. Therefore, by tailoring the shape, peak power level and/or amount of energy delivered in each pulse the anneal process may be improved. In one aspect, the pulse is gaussian shaped.

Figure 4C:
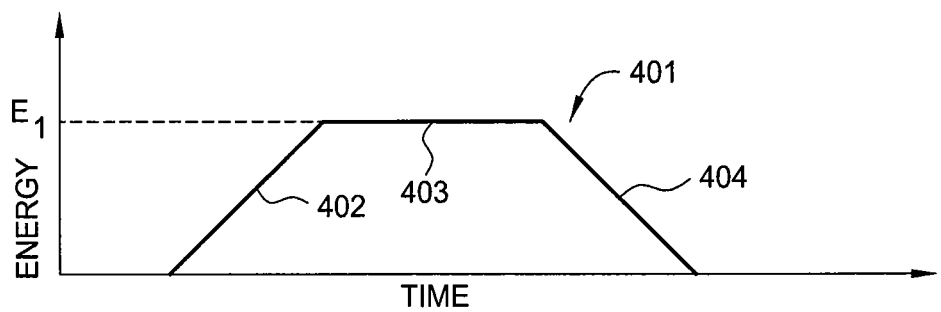

FIG. 4C graphically illustrates a pulse of electromagnetic radiation (e.g., pulse 401) that is trapezoidal in shape. In this case, in two different segments (e.g., 402 and 404) of the pulse 401 the energy delivered is varied as a function of time. While FIG. 4C illustrates a pulse 401 profile, or shape, in which the energy versus time varies in a linear fashion, this is not intended to be limiting as to the scope of the invention since the time variation of the energy delivered in a pulse may, for example, have a second degree, third degree, or fourth degree shaped curve. In another aspect, the profile, or shape, of the energy delivered in a pulse as a function of time may be a second order, a third order, or exponential-shaped curve. In another embodiment, it may be advantageous to use a pulse having different shapes (e.g., rectangular and triangular modulation pulse, sinusoidal and rectangular modulation pulse, rectangular, triangular and sinusoidal modulation pulse, etc.) during processing to achieve the desired annealing results.

Depending on the properties of the various regions of the device the shape of the delivered pulse of electromagnetic radiation may be tailored to improve the anneal process results. Referring to FIG. 4B, for example, in some situations in which various regions of a substrate that are to be melted during the anneal process are thermally isolated from other regions of the device by areas that have a low thermal conductivity, use of a pulse having a shape similar to pulse 401B may be advantageous. A pulse having a longer duration may be advantageous, since the more thermally conductive material regions of the substrate will have more time to dissipate the heat by conduction, while the regions that are to be melted are more thermally isolated thus allowing the temperature in the regions that are to be melted to rise to a melting point temperature. In this case the duration, peak power level and total energy output of the pulse can be appropriately selected, so that the areas that are not intended to melt will not reach their melting point. The process of tailoring the shape of the pulse may also be advantageous when surfaces of varying emissivity are used to create a melting point contrast.

Referring to FIG. 4C, in one embodiment, the slope of the segment 401, the shape of the segment 401, the shape of the segment 403, the time at a power level (e.g., segment 403 at the energy level $E_1$), the slope of the segment 404, and/or the shape of the segment 404 are adjusted to control the annealing process. It should be noted that it is generally not desirable to cause the material within the annealed regions to vaporize during processing due to particle and process result variability concerns. It is therefore desirable to adjust the shape of the pulse of energy to rapidly bring the temperature of the annealed region to it melting point without superheating the region and causing vaporization of the material. In one embodiment, as shown FIG. 4G, the shape of the pulse 401 may adjusted so that it has multiple segments (i.e., segments 402, 403A, 403B, 403C, and 404) are used to rapidly bring the anneal region to its melting point and then hold the material in a molten state for a desired period of time (e.g., $t_1$), while preventing vaporization of material within the annealing region. The length of time, the shape of the segments and the duration of each of the pulse segments may vary as the size, melt depth, and the material contained within the annealing regions is varied.

Figure 4D:
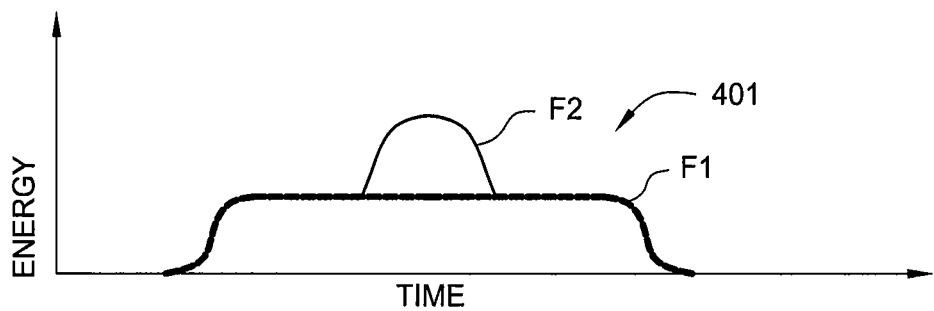

In another aspect, multiple wavelengths of radiant energy may be combined to improve the energy transfer to the desired regions of the substrate to achieve an improved melting point contrast, and/or improve the anneal process results. In one aspect, the amount of energy delivered by each of the combined wavelengths is varied to improve the melting point contrast, and improve the anneal process results. FIG. 4D illustrates one example in which a pulse 401 contains two wavelengths that may deliver differing amounts of energy per unit time to a substrate 10 in order to improve the melting point contrast and/or improve the anneal process results. In this example, a frequency F1 is applied to the substrate at a constant level over the period of the pulse and another frequency F2 is applied to the substrate 10 at a constant level for most of the period except for a portion that peaks for a period of time during the period of the pulse.

Figure 4E:
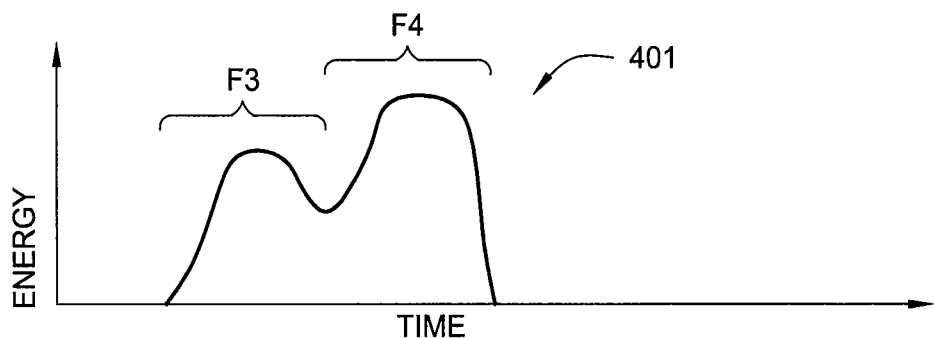

FIG. 4E graphically illustrates a plot of a pulse 401 that has two sequential segments that deliver energy at two different frequencies F3 and F4. Therefore, since various regions of the substrate may absorb energy at different rates at different wavelengths the use of pulse that contains multiple wavelengths that can deliver variable amounts of energy, as shown in FIGS. 4D and 4E, may be advantageous to achieve desirable annealing process results.

Figure 4F:
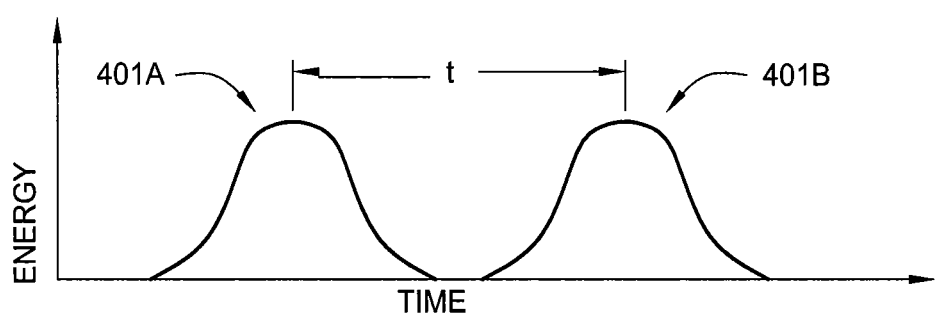
Figure 4G:
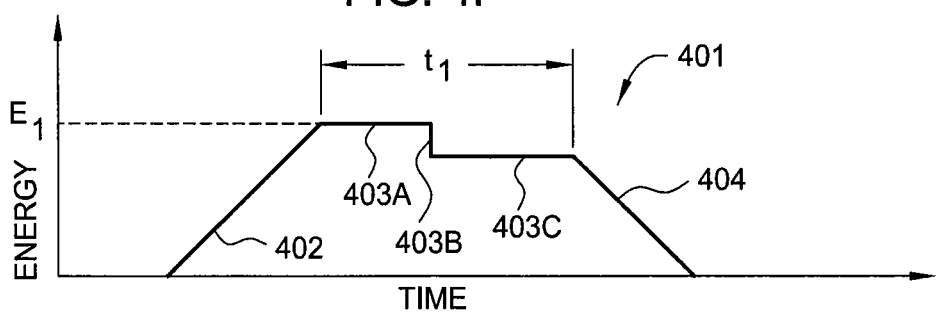

In one embodiment, two or more pulses of electromagnetic radiation are delivered to a region of the substrates at differing times so that the temperature of regions on the substrate surface can be easily controlled. FIG. 4F graphically illustrates a plot of two pulses 401A and 401B that are delivered a varying distance in time apart, or period (t), to selectively melt certain regions on the surface of a substrate. In this configuration, by adjusting the period (t) between the subsequent pulses, the peak temperature reached by regions on the substrate surface can be easily controlled. For example, by reducing the period (t), or frequency, between pulses the heat delivered in the first pulse 401A has less time to dissipate the heat before the second pulse 401B is delivered, which will cause the peak temperature achieved in the substrate to be higher than when the period between pulses is increased. In this way by adjusting the period the energy and melt temperature can be easily controlled. In one aspect, it may desirable to assure that each pulse by itself does not contain enough energy to cause the substrate to reach the melt temperature, but the combination of the pulses causes the regions 202 to reach the melt temperature. This process of delivering multiple pulses, such as two or more pulses, will tend to reduce the thermal shock experienced by the substrate material versus delivering a single pulse of energy. Thermal shock can lead to damage of the substrate and generate particles that will create defects in subsequent processing steps performed on the substrate.

Referring to FIG. 4F, in one embodiment, two or more energy sources, such as lasers, are operated in sequence so as to shape the thermal profile of the surface of a substrate as a function of time. For example, one laser or an array of lasers may deliver a pulse 401A that elevates the surface of the substrate to a temperature $T_o$ for a time $t_1$. Prior to or at the end of $t_1$, a second pulse 402B is delivered from a second laser, or from multiple lasers operating in tandem, that brings the substrate temperature to a temperature $T_1$ for a time $t_2$. The thermal profile can thus be shaped by controlling the sequencing pulses of energy delivered from the multiple lasers. This process may have thermal processing benefits, such as but not limited to the application of controlling dopant diffusion and the direction of the dopant diffusion.

Electromagnetic Radiation Pulses

For the purpose of delivering sufficient electromagnetic radiation (light) to the surface of a silicon containing substrate, or substrate comprised of another material requiring thermal processing, the following a process controls may be used.

In one embodiment, two or more electromagnetic energy sources, such as lasers, are operated in sequence so as to shape the thermal profile of the surface being thermally processed and where the lasers are operated in such a manner as to correct for pulse-to-pulse energy variations. In one aspect, the source 20, schematically illustrated in FIGS. 1 and 9, contains two or more electromagnetic energy sources, such as but not limited to an optical radiation source (e.g., laser), an electron beam source, an ion beam source, and/or a microwave energy source. The pulse-to-pulse energy from a device such as a pulsed laser may have a percent variation of each pulse. The variation in pulse energy may be unacceptable for the substrate thermal process. To correct for this pulse variation, one or more laser(s) deliver a pulse that elevates the substrate temperature. Then an electronic controller (e.g., controller 21 in FIG. 1), which is adapted to monitor the pulses delivered and the energy, or rise time, of the pulse that is in delivery, then is used to calculate the amount of energy required to "trim" or adjust the thermal profile (e.g., temperature of a region of the substrate as a function of time) so that it is within process targets and command a second smaller laser or series of smaller lasers to deliver the final energy to complete the thermal processing. The electronic controller generally uses one or more conventional radiation detectors to monitor the energy and/or wavelength of pulses delivered to the substrate. The smaller lasers may also have peak-to-peak variation in pulse output energy, but because they deliver substantially less energy per pulse than the initial pulse (or pulses) at the start of the surface treatment this error will generally be within process limits. The electronic controller is thus adapted to compensate for the variation in energy delivered by a pulse, and thus assure that a desired energy level is delivered during the thermal process.

In one aspect, the two or more energy sources, discussed above, may also be implemented using a single color (wavelength) of laser light with a bandwidth of color frequency, multiple wavelengths, single or multiple temporal and spatial laser modes, and polarization states.

The output of the laser or lasers will likely not have the correct spatial and temporal energy profile for delivery to the substrate surface. Therefore, a system using microlenses to shape the output of the lasers is used to create a uniform spatial energy distribution at the substrate surface. Selection of glass types and geometry of the microlenses may compensate for thermal lensing effects in the optical train necessary for delivering the pulsed laser energy to the substrate surface.

High frequency variations in pulse energy at the substrate surface, known as speckle, is created by neighboring regions of constructive and destructive phase interference of the incident energy. Speckle compensation may include the following: a surface acoustic wave device for rapidly varying the phase at the substrate such that this rapid variation is substantially faster than the thermal processing time of the laser pulse or pulses; pulse addition of laser pulses; alternating polarization of laser pulses for example, delivery of multiple simultaneous or delayed pulses that are linearly polarized but have their polarization states (e-vectors) in a nonparallel condition.

Thermal Stabilizing Structures Formed on a Patterned Substrate

Figure 5A:
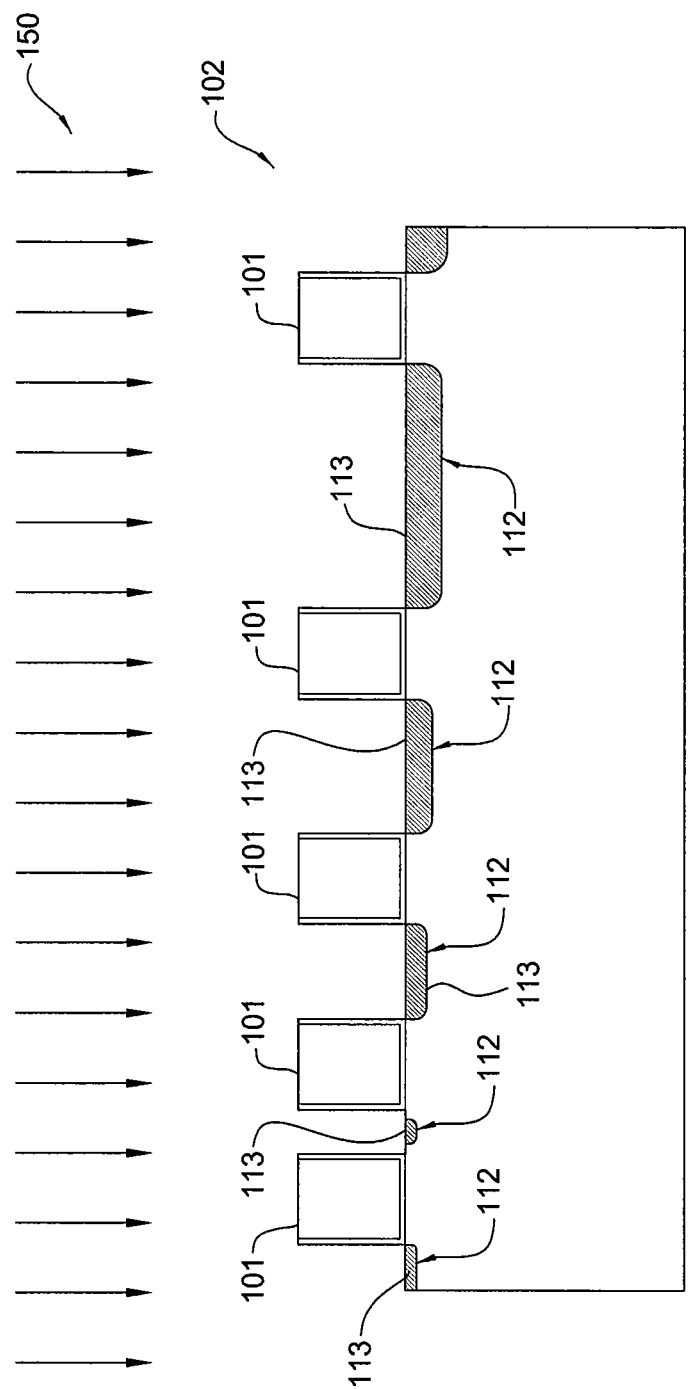
FIGS. 5A-5C illustrate a schematic side view of a region on a surface of a substrate described within an embodiment herein.
Figure 5B:
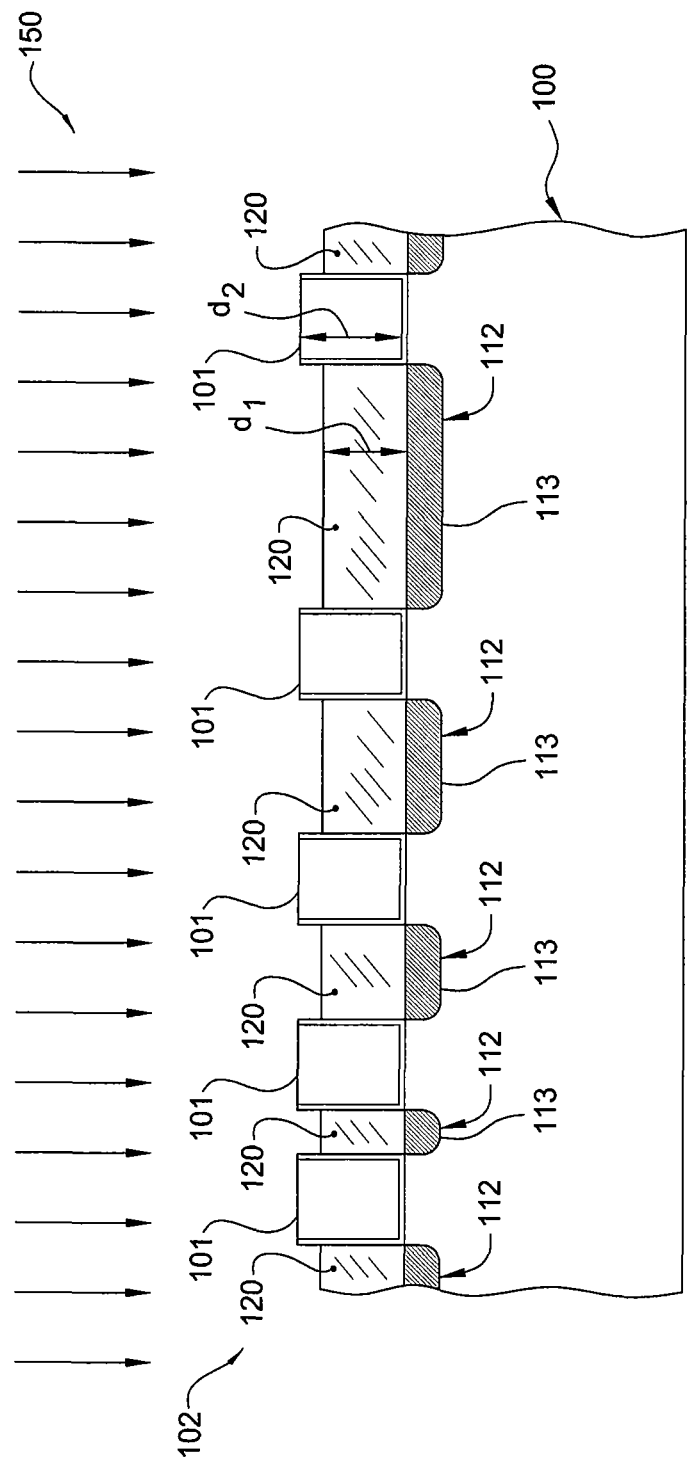
Figure 5C:
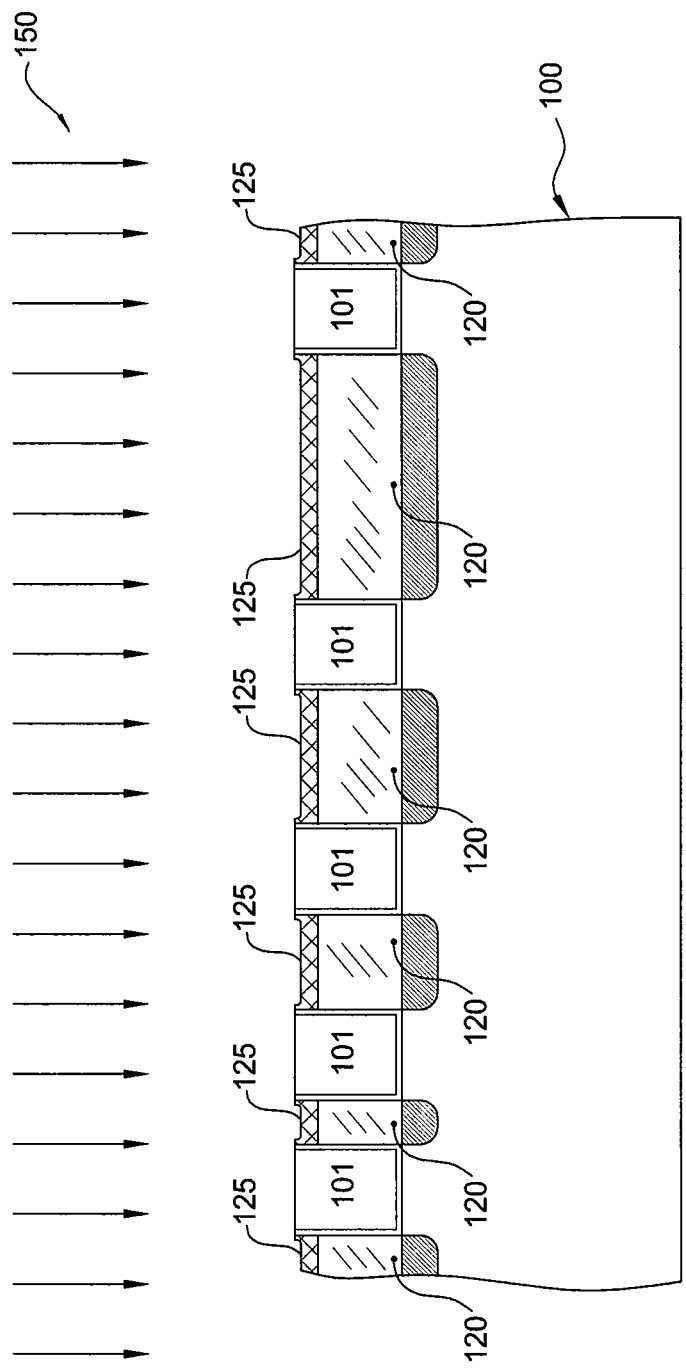

In one embodiment, as shown in FIGS. 5A-5C, a homogenizing layer (item 110 in FIG. 5B) is deposited on a surface of the substrate to reduce the variations in the depth, or volume, of the silicon region 112 melted when surface of the substrate is exposed to electromagnetic energy 150 delivered from an electromagnetic radiation source (not shown). The variation in the depth, or volume, of the region melted is affected by the variations in the mass density of the various regions of the patterned substrate, the absorption coefficient of the material on which the radiant energy impinges, and the various physical and thermal properties of the material (e.g., thermal conductivity, heat capacity, thickness of the material). In general the electromagnetic radiation source is designed to deliver electromagnetic energy to the surface of substrate to thermally process or anneal portions of the substrate surface. Typical electromagnetic radiation sources may include, but are not limited to optical radiation sources (e.g., lasers), electron beams, ion beams, or microwave sources.

The device structure formed on a surface 102 of the substrate 100 illustrated in FIGS. 5A-5C and 6A-6C are not intended to be limiting as to the scope of the invention described herein, since, for example, the silicon region 112 (e.g., source or drain regions in a MOS device) can be a raised or lowered relative to the position of the features 101 (e.g., gate in a MOS device) without varying from the scope of the invention described herein. As semiconductor device sizes decrease the position and geometry of structural elements of the devices formed on the surface of a substrate vary to improve device manufacturability or device performance.

FIG. 5A illustrates a cross-sectional view of a substrate 100 that has a plurality of features 101 and silicon regions 112 formed on a surface 102 of the substrate 100. As shown in FIG. 5A the surface 102 has multiple features 101 that are laterally spaced a varying distance apart. In one aspect, the features 101 are "gates" and the silicon regions 112 are "source and drain regions" used to form a metal oxide semiconductor (MOS) device on the substrate surface. In the configuration shown in FIG. 5A the incident electromagnetic energy 150 impinges the surface 102 causing the some regions of the surface 102 of the substrate to absorb the incident energy and possibly form melt regions 113. The physical, thermal and optical properties of the various materials exposed to the incident electromagnetic energy 150 will determine whether the various areas on the surface 102 will melt upon exposure to the delivered energy. It is believed that when the features 101 are polysilicon gates the absorption energy from a laser, at wavelengths <800 nm, will be significantly less than the energy absorbed by the silicon regions 112 that contain N-type or P-type doped silicon, such as found in a source or drain region of a MOS device. Therefore, it is believed that due to the heat capacity and thermal mass of the features 101, and their relative position to the silicon regions 112, the delivered electromagnetic energy 150 in the areas adjacent to the features 101 will remain cooler due to the diffusion of heat away from the melt region 113. The loss of heat to the features 101 will reduce the energy available to form the melt region 113 and thus affect the depth and/or volume, of the melt region 113. Therefore, there is a need for a way to reduce the variation in pattern density on the surface of the substrate.

FIG. 5B illustrates a cross-sectional view of a substrate 100 that has a plurality of features 101, silicon regions 112 and a homogenizing layer 120 formed on a surface 102 of the substrate 100. FIG. 5B is similar to FIG. 5A except the addition of the homogenizing layer 120. In general the homogenizing layer 120 is used to make the heat capacity of the surface 102 of the substrate 100 more uniform. In one embodiment, the thickness and material from which the homogenizing layer 120 is formed is selected to balance the heat capacity of the surface of the substrate to reduce the effect of a varying mass density across the substrate surface and thus reduce the variation in the depth and/or volume of the melt region 113. In general, the homogenizing layer 120 material is selected so that it will not melt during the subsequent annealing process and it can be selectively removed from the surface of the substrate after the annealing processes have been performed. In one aspect, the homogenizing layer 120 is a material that is similar in composition to the material that the features 101 are made from, such as, for example, a polysilicon containing material. In another aspect, the homogenizing layer 120 is a silicon carbide containing material or a metal (e.g., titanium, titanium nitride, tantalum, tungsten).

Preferably, the thickness of the homogenizing layer 120 (e.g., $d_1$) is selected so that the heat capacity of the device structure is uniform. In one aspect, the thickness, $d_1$ of the homogenizing layer 120 is governed by:

$$d_1 = (\alpha_1)^{0.5} \times [d_2/((\alpha_2)^{0.5})]$$

where $d_2$ = Thickness of the features 101 (see FIG. 5B)

$\alpha_1 = \kappa_1/(\rho_1 C_{p1})$ and $\alpha_2 = \kappa_2/(\rho_2 C_{p2})$ where $\kappa_1$ equals the thermal conductivity of the material used to form the homogenizing layer, $\rho_1$ equals the mass density of the material used to form the homogenizing layer 120, $C_{p1}$ equals heat capacity of the material used to form the homogenizing layer 120, $\kappa_2$ equals the thermal conductivity of the material used to form the features 101, $\rho_2$ equals the mass density of the material used to form the features 101, and $C_{p2}$ equals the heat capacity of the material used to form the features 101.

FIG. 6A Illustrates a series of method steps that may be used to form the homogenizing layer 120 on a surface 102 of the substrate 100. In step 190, shown in FIGS. 6A and 6B, the homogenizing layer 120 is deposited over the surface 102 (e.g., features 101) of the substrate 100 by use of a conventional deposition process, such as a chemical vapor deposition (CVD), plasma enhanced CVD, atomic layer deposition (ALD), plasma enhanced ALD, or spin coating type deposition process. In step 192, shown in FIGS. 6A and 6C, the surface 102 of the substrate 100 that contains the homogenizing layer 120 is planarized using a chemical mechanical polishing (CMP) process. In step 194, shown in FIGS. 6A and 6D, the homogenizing layer is then selectively etched using a selective material removal process, such as a wet etch or dry etch type process until a desired thickness $d_1$ is achieved.

Next, an amount of incident electromagnetic energy can be delivered to the surface of the substrate surface to cause the uniform annealing/melting of the material contained in the melt regions 113.

Absorption Layer Over Homogenous Layer

FIG. 5C is a cross-sectional view of a substrate 100 that contains the device illustrated in FIG. 5B with an added layer 125 deposited thereon to adjust the optical properties of various regions on the surface of the substrate. In one aspect, the layer 125 is added to improve the absorption of the electromagnetic energy 150 delivered to various regions of the substrate 100. In one embodiment, the layer 125 is the same as the coating 225 or the layer 226 described above. As shown in FIG. 5C the layer 125 is preferentially formed on the homogenizing layer 120 to improve the selectivity of energy delivered to the silicon regions 112. The desired thickness of the layer 125 may vary as the wavelength of the delivered electromagnetic energy 150 varies.

Referring to FIGS. 6A-6G, in one embodiment, after performing steps 190 through 194 the steps 196 and 198 may be used to form a selectively deposited absorbing layer 125. In step 196, shown in FIGS. 6E and 6F, the layer 125 is deposited over the features 101 and the homogenizing layer 120 formed in steps 190-194, discussed above. In step 198, shown in FIGS. 6E and 6G, the layer 125 is removed from the top surface of the features 101 by performing a material removal step, such as a planarization process typically completed by use of a chemical mechanical polishing (CMP) process. In one aspect, the deposited layer 125 is used to alter the melting point contrast between one or more desired regions on the substrate surface by allowing a differing amount of heat to be absorbed and transmitted to the melt regions 103 versus the regions between the melt regions, which are not in direct contact with the layer 125 and the homogenizing layer 120.

Diffraction Grating

One issue that arises when features of different sizes, shapes and distances apart are exposed to electromagnetic radiation is that depending on the wavelength of the electromagnetic radiation the amount of energy applied to the features may experience constructive or destructive interference due to diffraction effects that undesirably vary the amount of energy, or energy density (e.g., Watts/m$^2$), delivered to a desired region. Referring to FIG. 7, the spacing of the features 101 may differ such that the wavelength of the incident radiation varies across the surface causing a variation in energy density delivered across the surface 102 of the substrate 100.

In one embodiment, as shown in FIG. 7, a layer 726 is grown to a thickness that exceeds the height of all of features 101 to reduce the diffraction effect created by the irregular spacing between devices (e.g., features 101) formed on the surface of the substrate. In one aspect, not shown, the surface 720 of the layer 726 is further planarized (e.g., CMP process) to reduce any inherent topographical variation in the surface 720 of the substrate 10. In general, it is desirable to reduce the topographical variation on the surface of the substrate to have a peak-to-valley variation (see "PV" in FIG. 7) across the surface of the substrate of less than about a quarter of the wavelength (<¼λ) of the energy delivered during the annealing process. It is also desirable to have the average period between peaks (see "PP" in FIG. 7) across the surface of the substrate greater than about five times the wavelength (e.g., >5λ) of the energy delivered during the annealing process. In one example, when using an 800 nm wavelength laser source, it is desirable to reduce the inherent topographical variation in the surface 720 to an peak-to-valley variation of less than about 200 nm and a period between peak variation greater than about 4000 nm. In one aspect, the layer 726 is a carbon layer deposited by a CVD deposition process or a material discussed in conjunction with layer 125, coating 225, and layer 226 discussed above.

In one embodiment, the design of the devices formed on the surface of a substrate that is exposed to incident electromagnetic radiation is specifically designed and arranged so that a desired diffraction pattern is created to improve the melting point contrast between different zones. The physical arrangement of the various features are thus tailored for a desired wavelength, or wavelengths, of the incident radiation "B" (FIG. 7) used to anneal the surface of the substrate.

Forming Amorphous Region in a Substrate

In one embodiment, one or more processing steps are performed to selectively form an amorphous region 140 in an originally single crystal or polycrystalline material to reduce the amount of damage created during subsequent implantation processing steps and increase the melting point contrast of the amorphous region 140 relative to other areas of the substrate. Implanting dopants in an amorphous region, such as an amorphous silicon layer will tend to homogenize the implantation depth of the desired dopant at a fixed ion energy, due to lack of density variation across the various planes found in crystalline lattice structures (e.g., single crystal silicon). The implantation in an amorphous layer will tend to reduce the crystalline damage commonly found in traditional implantation processes in crystalline structures. Therefore, when the amorphous region 140 is subsequently re-melted using an anneal type process, as discussed above, the formed region can be recrystallized with a more homogenous doping profile and with reduced number of defects. The re-melting process also removes any damage created from the implant process. The formation of the amorphous region 140 will also reduced the melting point of the affected regions, which can thus improve the melting point contrast between the amorphous region 140 and the adjacent single crystal regions 141.

In one embodiment, a short dose of energy (item "B" in FIG. 8) is delivered to a substrate 10 to selectively modify and form an amorphous silicon layer in a desired region (e.g., amorphous region 140). In one aspect, a pulse, or dose, of electromagnetic energy is delivered to the desired region for a sufficiently short period of time to cause rapid melting and cooling of the affected amorphous region 140 to produce an amorphous region in the substrate. In this case the pulse of energy is for such a short duration that it produce a high regrowth velocity in the heated region to produce an amorphous region. In one aspect, the re-growth velocity in the heated region is greater than about 12 m/sec.

In one aspect, a pulse of energy is delivered to a desired region of a silicon substrate for period of less than about $10^{-8}$ seconds. In this aspect, the pulse of energy may be delivered from a laser that delivers a peak power greater than $10^9$ W/cm$^2$, and preferably in a range between about $10^9$ and about $10^{10}$ W/cm$^2$ for a period of less than about $10^{-8}$ seconds. In one aspect, the power, pulse duration, shape of the delivered dose to create the amorphous silicon layer may be varied to achieve an amorphous region 140 of a desired size, shape and depth. In one aspect, the wavelength of the delivered dose of energy is selected or varied to achieve a desired melt profile. In one aspect, the wavelength may be in the UV or IR wavelengths. In one aspect, the wavelength of the laser may be less than about 800 nm. In another aspect, the wavelength may be about 532 nm or about 193 nm.

In one embodiment, a mask is used to preferentially form the amorphous areas in various regions of the substrate surface.

Electromagnetic Radiation Delivery

Figure 9:
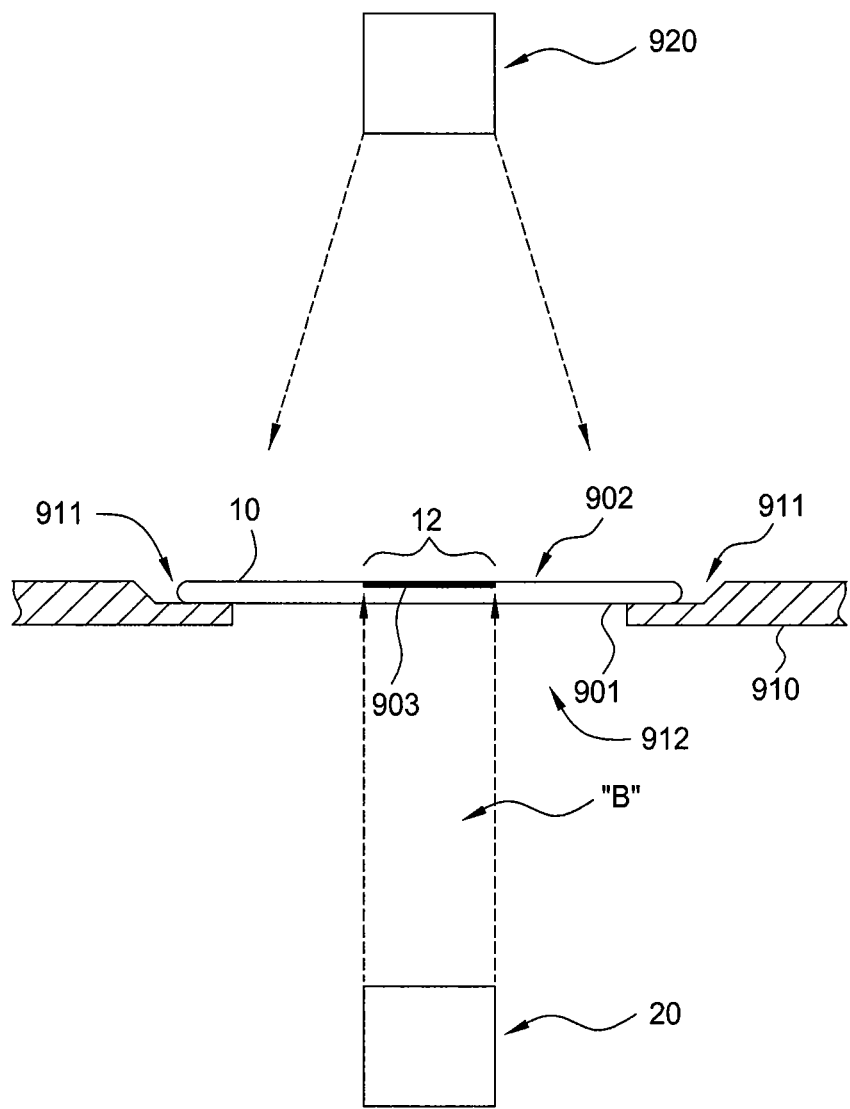
FIG. 9 illustrates a schematic side view of system that has an energy source that is adapted to project an amount of energy on a defined region of the substrate described within an embodiment herein.

FIG. 9 is a cross-sectional view of a region of a processing chamber that illustrates one embodiment in which an energy source 20 is adapted to deliver an amount of energy to an anneal region 12 of the substrate 10 from the backside surface 901 to preferentially melt certain desired regions within the anneal region 12. In one aspect, one or more defined regions of the substrate, such as anneal region 12, are exposed to the radiation from the energy source 20 at any given time. In one aspect, multiple areas of the substrate 10 are sequentially exposed to a desired amount of energy delivered through the backside surface 901 from the energy source 20 to cause the preferential melting of desired regions of the substrate. In one aspect, the anneal region 12 is sized to match the size of the die (e.g., item #13 in FIG. 1), or semiconductor devices, that are formed on the top surface 902 of the substrate 10. In one aspect, the boundary of the anneal region 12 is aligned and sized to fit within the "kurf" or "scribe" lines that define the boundary of each die. Therefore, the amount of process variation, due to the varying amount of exposure to the energy from the energy source 20 is minimized, since any overlap between the sequentially placed anneal regions 12 can be minimized. In one example, the anneal region 12 is a rectangular region that is about 22 mm by about 33 mm in size.

In one embodiment, the substrate 10 is positioned in a substrate supporting region 911 formed on a substrate support 910 that has an opening 912 that allows the backside surface 901 of the substrate 10 to receive energy delivered from the energy source 20. In this configuration the radiation "B" emitted from the energy source 20 to heat regions 903 that are adapted to absorb a portion of the emitted energy. The energy source 20 is generally adapted to deliver electromagnetic energy to preferentially melt certain desired regions of the substrate surface. Typical sources of electromagnetic energy include, but are not limited to an optical radiation source (e.g., laser), an electron beam source, an ion beam source, and/or a microwave energy source. In one aspect, the substrate 10 is exposed to a pulse of energy from a laser that emits radiation at one or more appropriate wavelengths for a desired period of time. In one aspect, pulse of energy from the energy source 20 is tailored so that the amount of energy delivered across the anneal region 12 and/or the amount of energy delivered over the period of the pulse is optimized to enhance preferential melting of certain desired areas. In one aspect, the wavelength of the laser is tuned so that a significant portion of the radiation is absorbed by a silicon layer disposed on the substrate 10. For laser anneal process performed on a silicon containing substrate, the wavelength of the radiation is typically less than about 800 nm, and can be delivered at deep ultraviolet (UV), infrared (IR) or other desirable wavelengths. In either case, the anneal process generally takes place on a given region of the substrate for a relatively short time, such as on the order of about one second or less.

In one aspect, the wavelength of the emitted radiation from the energy source 20 is selected so that the bulk material from which the substrate is formed is more transparent to the incident radiation than the areas near the top surface 902 that are to be preferentially melted by the exposure of the incident emitted radiation. In one aspect, the regions that are to be preferentially melted contain a material that absorbs an amount of the energy delivered through the backside of the substrate, such as a dopant material or ionizing crystal damage (e.g., crystal defects, Frenkel defects, vacancies) created during the implantation process. In general the dopant materials may be boron, phosphorous, or other commonly used dopant material used in semiconductor processing. In one embodiment, the bulk material from which the substrate is formed is a silicon containing material and the wavelength of the emitted radiation is greater than about 1 micrometer. In another aspect, the energy source 20 contains a $CO_2$ laser that is adapted to emit principal wavelength bands centering around 9.4 and 10.6 micrometers. In yet another aspect, the energy source 20 is adapted to deliver wavelengths in the infrared region, which is generally between about 750 nm and about 1 mm.

In one embodiment, an absorbing coating (not shown) is disposed over the anneal region 12 on the substrate 10 so that the incident radiation delivered through the back of the substrate can be absorbed before it passes through the substrate. In one aspect, the absorbing coating is a metal, such as titanium, titanium nitride, tantalum, or other suitable metal material. In another aspect, the absorbing coating is a silicon carbide material, amorphous carbon material, or other suitable material that is commonly used in semiconductor device manufacturing.

In one embodiment, two wavelengths of light are delivered to the desired regions of the substrate, so that the first wavelength of light is used to generate free carriers (e.g., electrons or holes) in the substrate from dopants or other ionizing crystal damage found in the desired annealing regions, so that the generated free carriers will absorb the energy delivered through the back of the substrate at a second wavelength. In one aspect, the first wavelength is the wavelength of "green light" (e.g., about 490 nm to about 570 nm) and/or shorter wavelengths. In one embodiment, the first wavelength is delivered at a desirable power density ($W/cm^2$) to the desired region of the substrate from a second source 920 that is on the opposite side of the substrate from the energy source 20, shown in FIG. 9. In another embodiment, the two wavelengths (e.g., first and second wavelengths) are delivered through the backside of the substrate from the source 20. In yet another embodiment, the two wavelengths (e.g., first and second wavelengths) at desirable power densities ($W/cm^2$) are delivered through the backside of the substrate from two separate sources of electromagnetic energy (not shown).

While the foregoing is directed to embodiments of the present invention, other and further embodiments of the invention may be devised without departing from the basic scope thereof, and the scope thereof is determined by the claims that follow.

We claim:

1. An apparatus for thermally processing a semiconductor substrate, comprising:
    a substrate support comprising a heat exchanging device;
    a first intense light source positioned to deliver a first amount of annealing energy to an anneal region;
    a second intense light source positioned to deliver a second amount of annealing energy to the anneal region;
    a first controller coupled to the heat exchange device; and
    a second controller coupled to the first controller, the first intense light source, and the second intense light source.

2. The apparatus of claim 1, further comprising one or more channels formed within the substrate support and in thermal communication with the heat exchanging device.

3. The apparatus of claim 1, further comprising a movable stage attached to the substrate support.

4. The apparatus of claim 1, wherein each of the first intense light source and the second intense light source delivers radiation at a wavelength between about 500 nm and about 11 micrometers.

5. The apparatus of claim 1, wherein the second controller controls combination of the first amount of anneal energy and the second amount of anneal energy.

6. The apparatus of claim 1, wherein the first and second intense light sources are configured to deliver multiple pulses of electromagnetic radiation that are linearly polarized.

7. The apparatus of claim 6, wherein the multiple pulses of electromagnetic radiation have their polarization states in a nonparallel condition.

8. An apparatus for thermally processing a semiconductor substrate, comprising:
   a substrate support comprising a heat exchanging device;
   a first intense light source positioned to deliver a first amount of annealing energy to an anneal region;
   a second intense light source positioned to deliver a second amount of annealing energy, combined with the first amount of anneal energy, to the anneal region;
   a first controller coupled to the heat exchange device;
   a second controller coupled to the first controller, the first intense light source, and the second intense light source to control combination of the first amount of anneal energy and the second amount of anneal energy; and
   one or more microlenses disposed between the first and second intense light sources and the substrate support.

9. The apparatus of claim 8, wherein the first intense light source is a pulsed laser and the second intense light source is a pulsed laser.

10. The apparatus of claim 9, wherein the first and second intense light sources are configured to deliver multiple simultaneous or delayed laser pulses that are linearly polarized.

11. The apparatus of claim 10, wherein the multiple laser pulses have their polarization states in a nonparallel condition.

12. The apparatus of claim 8, further comprising one or more channels formed within the substrate support and in fluid communication with the heat exchanging device.

13. The apparatus of claim 12, further comprising a movable stage attached to the substrate support.

14. An apparatus for thermally processing a semiconductor substrate, comprising:
   a first pulsed laser and a second pulse laser positioned to produce a combined pulse;
   one or more microlenses positioned to receive the combined pulse;
   a substrate support comprising a heat exchanging device;
   a first controller coupled to the heat exchange device; and
   a second controller coupled to the first controller, the first pulsed laser, and the second pulsed laser.

15. The apparatus of claim 14, further comprising one or more channels formed within the substrate support and in thermal communication with the heat exchanging device.

16. The apparatus of claim 15, further comprising a movable stage attached to the substrate support.

17. The apparatus of claim 16, wherein the first pulsed laser and the second pulsed laser each delivers radiation at a wavelength between about 500 nm and about 11 micrometers.

18. The apparatus of claim 17, wherein each of the one or more channels is a fluid channel.

19. An apparatus for thermally processing a semiconductor substrate, comprising:
   a substrate support;
   a first intense light source positioned to deliver a first amount of annealing energy to an anneal region;
   a second intense light source positioned to deliver a second amount of annealing energy to the anneal region; and
   a controller that is adapted to monitor the first amount and second amount of annealing energies delivered to the anneal region and independently control the magnitude and the time of delivery of the first amount and second amount of annealing energies based on a temperature of the anneal region,
   wherein the first and second intense light sources are configured to deliver multiple pulses of electromagnetic radiation that are linearly polarized.

20. The apparatus of claim 19, wherein the multiple pulses of electromagnetic radiation have their polarization states in a nonparallel condition.

* * * * *